(12) United States Patent
Nogawa

(10) Patent No.: US 6,642,996 B2
(45) Date of Patent: Nov. 4, 2003

(54) EXPOSURE APPARATUS

(75) Inventor: Hideki Nogawa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/987,211

(22) Filed: Nov. 13, 2001

(65) Prior Publication Data

US 2002/0057423 A1 May 16, 2002

(30) Foreign Application Priority Data

Nov. 16, 2000 (JP) ........................................ 2000-349778

(51) Int. Cl.$^7$ .............................................. G03B 27/58
(52) U.S. Cl. .............................. 355/72; 355/73; 355/30
(58) Field of Search ............................. 355/53, 72, 73, 355/75, 76, 30

(56) References Cited

U.S. PATENT DOCUMENTS

| | | | |
|---|---|---|---|
| 4,837,443 A | * 6/1989 | Young et al. | 250/440.11 |
| 5,170,207 A | * 12/1992 | Tezuka et al. | 355/53 |
| 5,633,698 A | 5/1997 | Imai | 355/72 |
| 5,925,887 A | 7/1999 | Sakai et al. | 250/548 |
| 5,973,764 A | * 10/1999 | McCullough et al. | 355/30 |
| 5,997,963 A | * 12/1999 | Davison et al. | 118/722 |
| 2001/0027351 A1 | * 10/2001 | Takeuchi et al. | 700/121 |
| 2002/0018190 A1 | * 2/2002 | Nogawa et al. | 355/30 |

FOREIGN PATENT DOCUMENTS

| | | |
|---|---|---|
| JP | 8-167549 | 6/1996 |
| JP | 9-148235 | 6/1997 |

OTHER PUBLICATIONS

Okabe, Hideo. "Photochemistry of Small Molecules," A Wiley–Interscience Publication, New York: 1978, pp. 177–179.

* cited by examiner

Primary Examiner—Russell Adams
Assistant Examiner—D. Ben Esplin
(74) Attorney, Agent, or Firm—Fitzpatrick, Cella, Harper & Scinto

(57) ABSTRACT

A scanning exposure apparatus for exposing a substrate with a pattern formed on an original while scanning the original and the substrate. The apparatus includes a chuck for holding a substrate, a stage for moving the chuck to align the substrate, a mechanism for purging an exposure optical path near the stage with inert gas, the mechanism having a cover covering the exposure optical path between a substrate-side lower end of an optical system and a vicinity of the stage, and a supply port for supplying inert gas into the cover, and a top plate which is mounted on the stage and has a surface substantially flush with a surface of the substrate. The top plate is arranged to form a gap between the top plate and a side surface of the substrate, a depth of the gap is not less than a width of the gap, and a dimension from the side surface of the substrate to an outer edge of the top plate is larger than that of a substrate-side opening of the cover in a scanning direction.

70 Claims, 35 Drawing Sheets

FIG. 33

| URL | http://www.maintain.co.jp/db/input.html |

TROUBLE DB INPUT WINDOW

OCCURRENCE DATE [2000/3/15] ~404
TYPE OF APPARATUS [**********] ~401
SUBJECT [OPERATION ERROR (START-UP ERROR)] ~403
DEVICE S/N [465NS4580001] ~402
DEGREE OF URGENCY [D] ~405

SYMPTOM [LED IS KEPT FLICKERING AFTER POWER-ON] ~406

REMEDY [POWER ON AGAIN (PRESS RED BUTTON IN ACTIVATION)] ~407

PROGRESS [INTERIM HAS BEEN DONE] ~408

[SEND] [RESET]

410 — LINK TO RESULT LIST DATABASE
411 — SOFTWARE LIBRARY
412 — OPERATION GUIDE

SEMICONDUCTOR DEVICE MANUFACTURING FLOW

EXPOSURE APPARATUS

FIELD OF THE INVENTION

The present invention relates to an exposure apparatus for projecting and transferring the pattern of a master such as a mask onto a member such as a wafer coated with a photosensitive agent via a projection optical system.

BACKGROUND OF THE INVENTION

A conventional manufacturing process for a semiconductor element such as an LSI or VLSI formed from a micropattern uses a reduction type projection exposure apparatus for printing by reduction projection a circuit pattern drawn on a mask onto a substrate coated with a photosensitive agent. With an increase in the packing density of semiconductor elements, demands have arisen for further micropatterning. Exposure apparatuses are coping with micropatterning along with the development of a resist process.

Methods of increasing the resolving power of the exposure apparatus include a method of changing the exposure wavelength to a shorter one, and a method of increasing the numerical aperture (NA) of the projection optical system.

As for the exposure wavelength, a KrF excimer laser with an oscillation wavelength of 365-nm i-line to recently 248 nm, and an ArF excimer laser with an oscillation wavelength around 193 nm have been developed. A fluorine ($F_2$) excimer laser with an oscillation wavelength around 157 nm is also under development.

An ArF excimer laser with a wavelength around ultraviolet rays, particularly, 193 nm, and a fluorine ($F_2$) excimer laser with an oscillation wavelength around 157 nm are known to have an oxygen ($O_2$) absorption band around their wavelength band.

For example, a fluorine excimer laser has been applied to an exposure apparatus because of a short wavelength of 157 nm. The 157-nm wavelength falls within a wavelength region generally called a vacuum ultraviolet region. Light in this wavelength region is greatly absorbed by oxygen molecules. Light hardly passes through the air. Thus, the fluorine excimer laser can only be applied in a low-oxygen-concentration environment. According to "Photochemistry of Small Molecules" (Hideo Okabe, A Wiley-Interscience Publication, 1978, page 178), the absorption coefficient of oxygen to 167-nm light passes through a gas at an oxygen concentration of 1% at one atmospheric pressure, the transmittance per cm is only $$T=\exp(-190\times 1 \text{ cm}\times 0.01 \text{ atm})=0.150.$$

Oxygen absorbs light to generate ozone, and the ozone promotes absorption of light, greatly decreasing the transmittance. In addition, various products generated by ozone are deposited on the surface of an optical element, decreasing the efficiency of the optical system.

To prevent this, the oxygen concentration in the optical path is suppressed to a low level of several ppm order or less by a purge means using inert gas such as nitrogen in the optical path of the exposure optical system of a projection exposure apparatus using a far ultraviolet laser such as an ArF excimer laser or fluorine ($F_2$) excimer laser as a light source.

In such an exposure apparatus using an ArF excimer laser with a wavelength around ultraviolet rays, particularly, 193 nm, or a fluorine ($F_2$) excimer laser with a wavelength around 157 nm, an ArF excimer laser beam or fluorine ($F_2$) excimer laser beam is readily absorbed by a substance such as oxygen. Oxygen in the optical path must be purged to an oxygen concentration of several ppm order or less. This also applies to moisture, which must be removed to the ppm order or less.

SUMMARY OF THE INVENTION

It is an object of the present invention to provide an exposure apparatus for strictly removing an exposure obstacle such as oxygen or moisture in an exposure optical path, and performing stable exposure.

To achieve the above object, according to the present invention, there is provided an exposure apparatus comprising a chuck for holding a substrate, a stage for moving the chuck to align the substrate, a mechanism for purging an exposure optical path near the stage with inert gas, and a top plate which is mounted on the stage and has a surface almost flush with a surface of the substrate, wherein a gap is formed between a side surface of the substrate and the top plate, and a depth of the gap is equal to or larger than a width of the gap.

A side surface of the chuck preferably has an inclined surface not perpendicular to the surface of the substrate. A side surface of a step between the surface of the top plate, and a bottom of the gap between the side surface of the substrate and the top plate preferably has an inclined surface not perpendicular to the surface of the substrate. A depth of the gap is preferably 1 mm or more from the surface of the substrate. A difference between the surface of the substrate and the surface of the top plate is preferably 4 mm or less.

To achieve the above object, according to the present invention, there is provided another exposure apparatus comprising a chuck for holding a substrate, a stage for moving the chuck to align the substrate, a mechanism for purging an exposure optical path near the stage with inert gas, and a top plate which is mounted on the stage and has a surface almost flush with a substrate support surface of the chuck.

It is preferable to form a gap between a side surface of the chuck and the top plate, and to form a vent hole which is larger in volume than the gap and communicates with the gap. A width between a side surface of the chuck and the top plate is preferably smaller than a width between the side surface of the chuck and an inner surface of the top plate. The exposure apparatus preferably further comprises a supply port for supplying gas into the gap formed between a side surface of the chuck and the top plate. The exposure apparatus preferably further comprises a vent hole which makes the gap formed between a side surface of the chuck and the top plate communicate with the surface of the top plate. The exposure apparatus preferably further comprises a vent hole which makes the gap formed between a side surface of the chuck and the top plate communicate with an opening formed in a surface almost parallel to a scan direction of the stage. An angle defined by the surface having the opening and the scan direction is preferably 30° or less. A side surface of the chuck preferably has an inclined surface not perpendicular to a surface of the substrate. A difference in level between the substrate support surface of the chuck and the surface of the top plate is preferably 3 mm or less.

To achieve the above object, according to the present invention, there is provided still another exposure apparatus comprising a chuck for holding a substrate, a stage for moving the chuck to align the substrate, a mechanism for purging an exposure optical path near the stage with inert gas, and a top plate which is mounted on the stage and has a surface almost flush with a chuck support surface.

A difference in level between the chuck support surface of the stage and the surface of the top plate is preferably 2 mm or less.

To achieve the above object, according to the present invention, there is provided still another exposure apparatus comprising a chuck for holding a substrate, a stage for moving the chuck to align the substrate, a mechanism for purging an exposure optical path near the stage with inert gas, and a top plate which is mounted on the stage and forms a surface almost flush with a surface of the substrate, wherein a gap is formed between a side surface of the substrate and the top plate, and a vent hole, which is larger in volume than the gap and communicated with the gap is formed.

To achieve the above object, according to the present invention, there is provided still another exposure apparatus comprising a chuck for holding a substrate, a stage for moving the chuck to align the substrate, a mechanism for purging an exposure optical path near the stage with inert gas, and a top plate which is mounted on the stage and forms a surface almost flush with a surface of the substrate, wherein a gap between a side surface of the substrate and the surface of the top plate is smaller in width than a gap between a side surface of the chuck and the top plate.

To achieve the above object, according to the present invention, there is provided still another exposure apparatus comprising a chuck for holding a substrate, a stage for moving the chuck to align the substrate, a mechanism for purging an exposure optical path near the stage with inert gas, a top plate which is mounted on the stage and forms a surface almost flush with a surface of the substrate, and a supply port for supplying gas into a gap formed between a side surface of the substrate and the top plate.

To achieve the above object, according to the present invention, there is provided still another exposure apparatus comprising a chuck for holding a substrate, a stage for moving the chuck to align the substrate, a mechanism for purging an exposure optical path near the stage with inert gas, a top plate which is mounted on the stage and forms a surface almost flush with a surface of the substrate, and a vent hole which makes a gap between a side surface of the substrate and the top plate communicate with the surface of the top plate.

To achieve the above object, according to the present invention, there is provided still another exposure apparatus comprising a chuck for holding a substrate, a stage for moving the chuck to align the substrate, a mechanism for purging an exposure optical path near the stage with inert gas, a top plate which is mounted on the stage and forms a surface almost flush with a surface of the substrate, and a vent hole which makes a gap between a side surface of the substrate and the top plate communicate with an opening perpendicular to a plane almost parallel to a scan direction of the stage.

A side surface of a step formed by the surface of the top plate, and a bottom of a gap between a side surface of the substrate and the top plate preferably has an inclined surface not perpendicular to a surface of the substrate. A difference between a surface of the substrate and the surface of the top plate is preferably 4 mm or less.

To achieve the above object, according to the present invention, there is provided still another exposure apparatus comprising a chuck for holding a substrate, a stage for moving the chuck to align the substrate, a mechanism for purging an exposure optical path near the stage with inert gas, and a top plate which is mounted on the stage to hold the chuck, wherein a side surface of the chuck has an inclined surface.

To achieve the above object, according to the present invention, there is provided still another exposure apparatus comprising a chuck for holding a substrate, a stage for moving the chuck to align the substrate, a mechanism for purging an exposure optical path near the stage with inert gas, and a top plate which is mounted on the stage to hold the chuck, wherein a side surface of a step formed on the top plate has an inclined surface.

The purge mechanism preferably has a cover for covering an exposure optical path from a substrate-side lower end of a projection or illumination optical system to a vicinity of the stage, and a supply port for supplying inert gas into the cover. The supply port preferably includes at least one nozzle. The supply port preferably serves as the cover. It is preferable that one inner surface of the cover has a supply port for supplying purge gas, and the other of the cover has a recovery port for discharging purge gas. The cover preferably includes an air curtain formed from inert gas. The inert gas preferably includes any one of nitrogen, helium, and argon.

The top plate is preferably integrated with the stage.

The exposure light preferably includes ultraviolet rays. The ultraviolet rays preferably include a laser beam from a laser serving as a light source. The laser preferably includes a fluorine or an ArF excimer laser.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 33 is a view showing an example of a user interface;

DETAILED DESCRIPTION OF THE PREFERRED EMBODIMENTS

Figure 26:
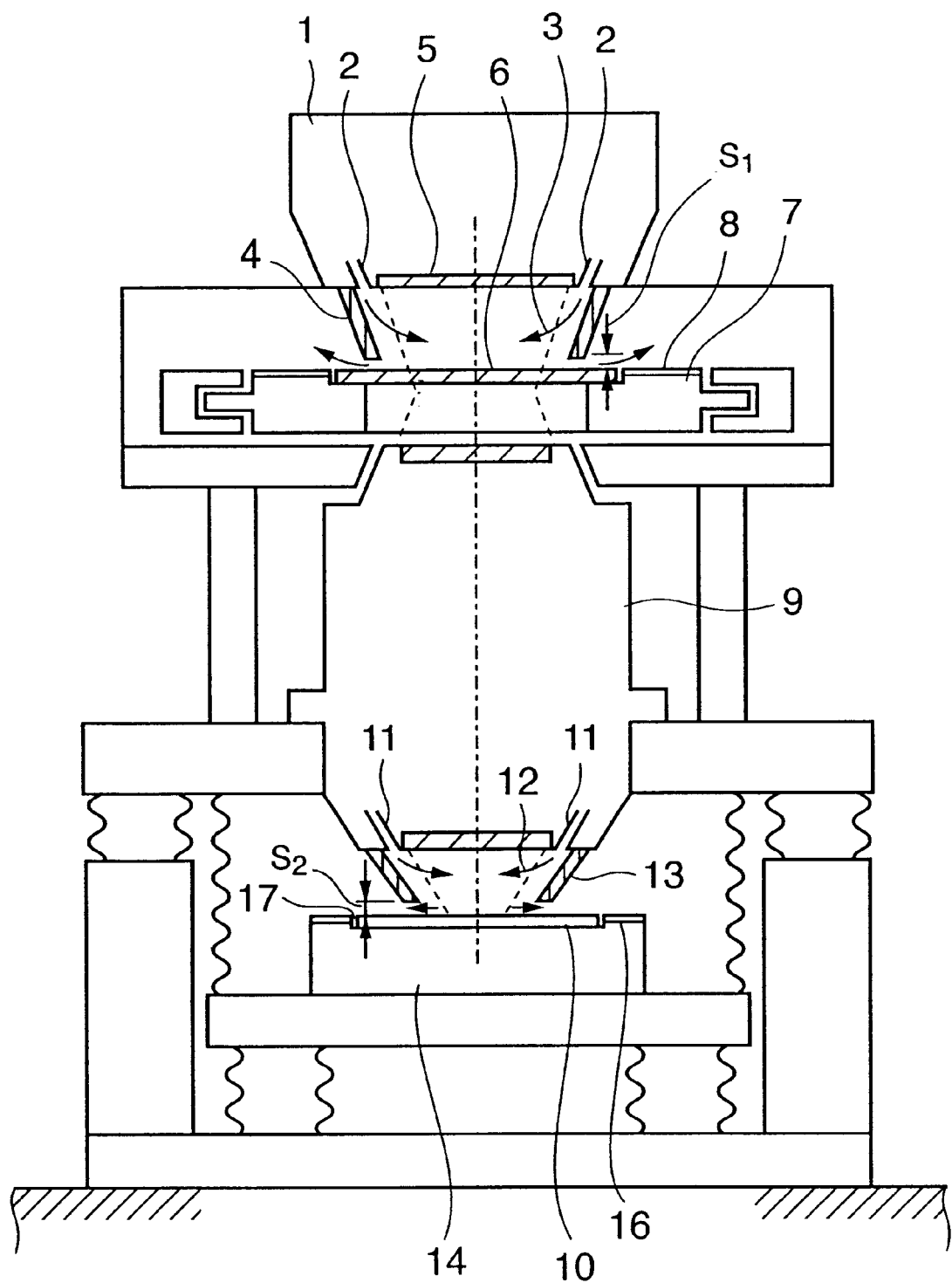
FIG. 26 is a sectional view for explaining a projection exposure apparatus according to another embodiment.

FIG. 26 shows an example of an exposure apparatus for purging an exposure optical path near a stage with inert gas.

As described above, an exposure optical path near a wafer stage and the like in an exposure apparatus must be purged with inert gas in order to ensure the transmittance or stability of exposure light such as ultraviolet rays. For this purpose, as shown in FIG. 26, a cover 13 for covering the exposure optical path is arranged from the wafer-side lower end of a projection optical system 9 toward the vicinity of a wafer stage 14 in the exposure apparatus. Supply ports 11 for supplying purge gas made of inert gas into the cover 13 are formed to purge the interior of the cover 13. A top plate 16 flush with a wafer 10 is set around the wafer 10. This prevents the opening of the cover 13 from shifting from the top plate region including pre-scan sections before and after scanning exposure of a shot at the wafer periphery. Entrance of oxygen, moisture, or the like, from the outside of the cover 13 is cut off.

A groove-like gap 17 with, e.g., a width of about 1 mm and a depth corresponding to a wafer thickness (e.g., 0.775 mm for a 300-mm thick wafer) must be formed around the entire wafer 10 between the wafer 10 and the top plate 16 in order to permit the shape tolerance of the wafer 10 or the positional precision of the wafer 10 set on the wafer stage 14. The groove-like gap 17 must be purged.

Figure 27:
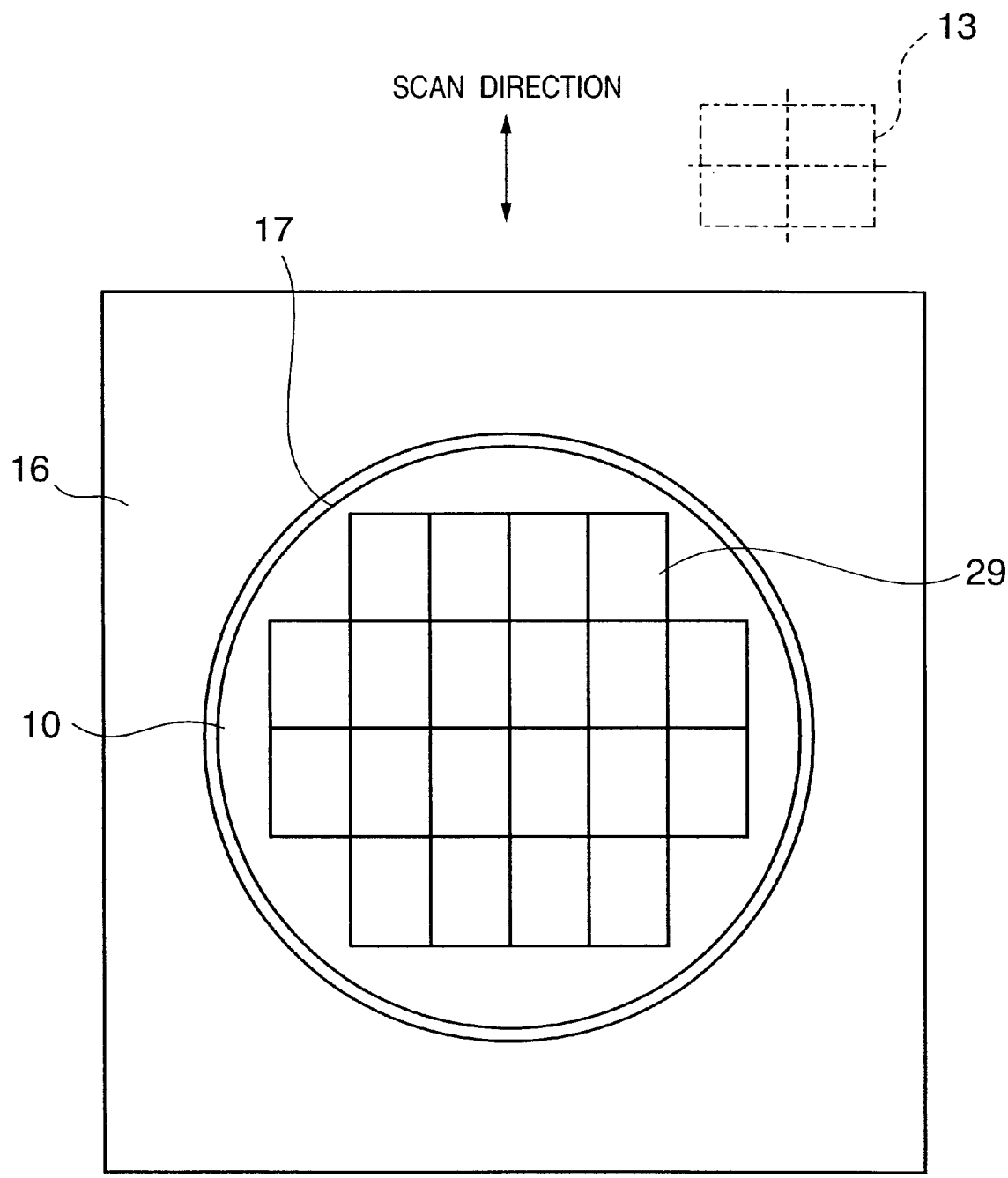
FIG. 27 is a plan view for explaining the structure of the projection exposure apparatus near a wafer according to the other embodiment.

Scanning exposure of a first shot 29 of a shot layout shown in FIG. 27 after wafer exchange will be exemplified.

Figure 28:
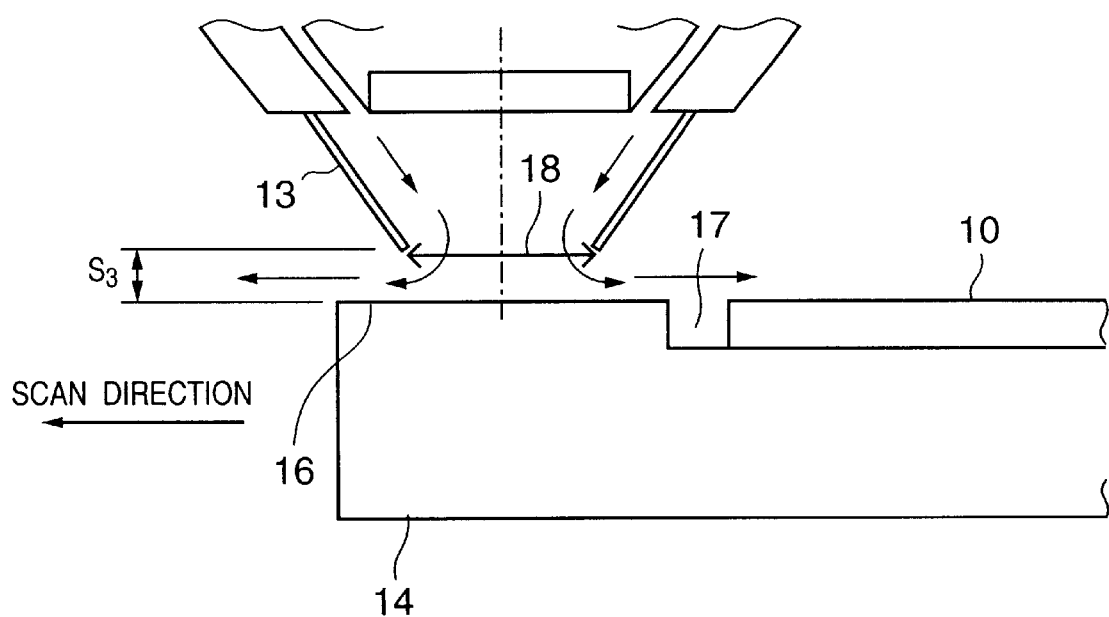
FIG. 28 is a sectional view for explaining the structure of the projection exposure apparatus near the wafer according to the other embodiment.
Figure 29:
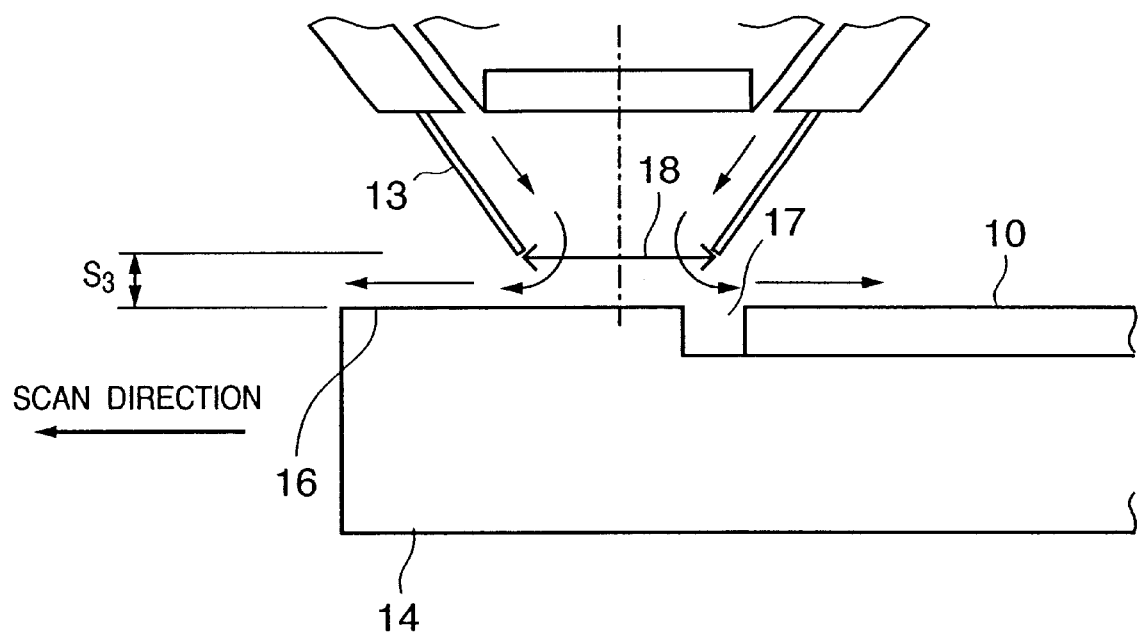
FIG. 29 is a sectional view for explaining the structure of the projection exposure apparatus near the wafer according to the other embodiment.

In setting the wafer 10 on the wafer stage 14, the wafer stage 14 is removed from below the cover 13. The surface of the wafer 10, the surface of the top plate 16, and the groove-like gap 17 between the wafer 10 and the top plate 16 are not purged with inert gas from the cover 13, as shown in FIG. 28. After the wafer stage 14 starts pre-scan in order to expose the first shot 29, the top plate 16 moves to below the cover 13, and covers an entire opening 18 of the cover 13, as shown in FIG. 28. At this time, the inside of the cover 13 becomes a positive pressure with respect to the outside. Inert gas is supplied from a gap s3 between the cover 13 and the top plate 16, thereby cutting off entrance of oxygen, moisture, or the like from the outside of the cover 13. As a result, purge starts inside the cover 13. Inert gas supplied from the gap s3 between the cover 13 and the top plate 16 to the wafer 10 flows along the surfaces of the top plate 16 and wafer 10. As the wafer stage 14 moves, the end of the wafer surface is purged to a certain degree even before the end of the surface of the wafer 10 reaches the end of the cover 13.

Figure 19:
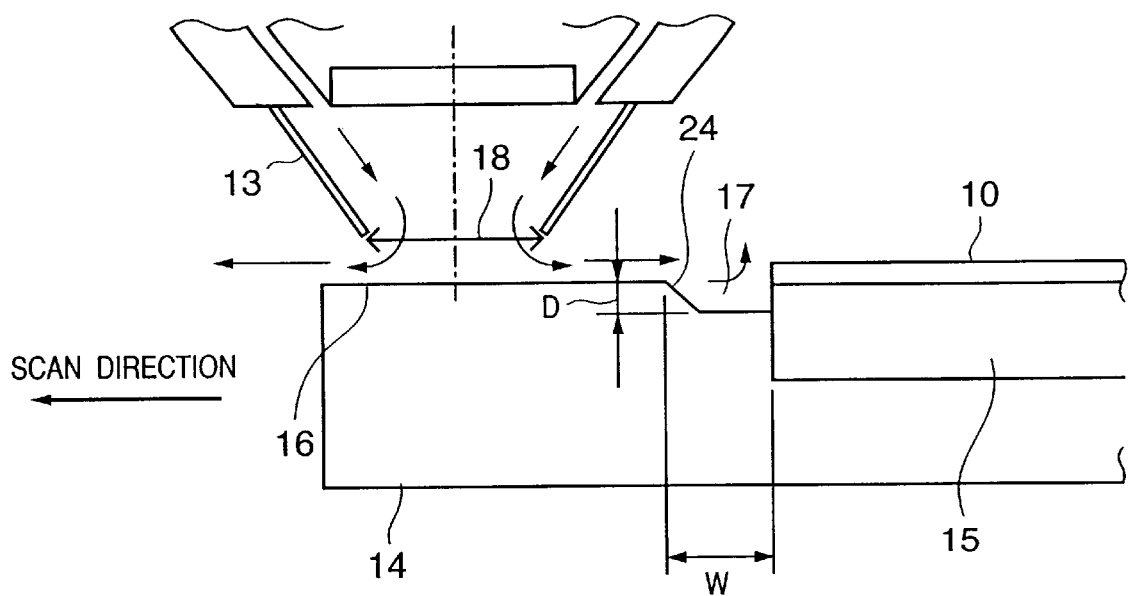
FIG. 19 is a sectional view showing the schematic structure of the projection exposure apparatus near the wafer according to the sixth embodiment of the present invention.
Figure 30:
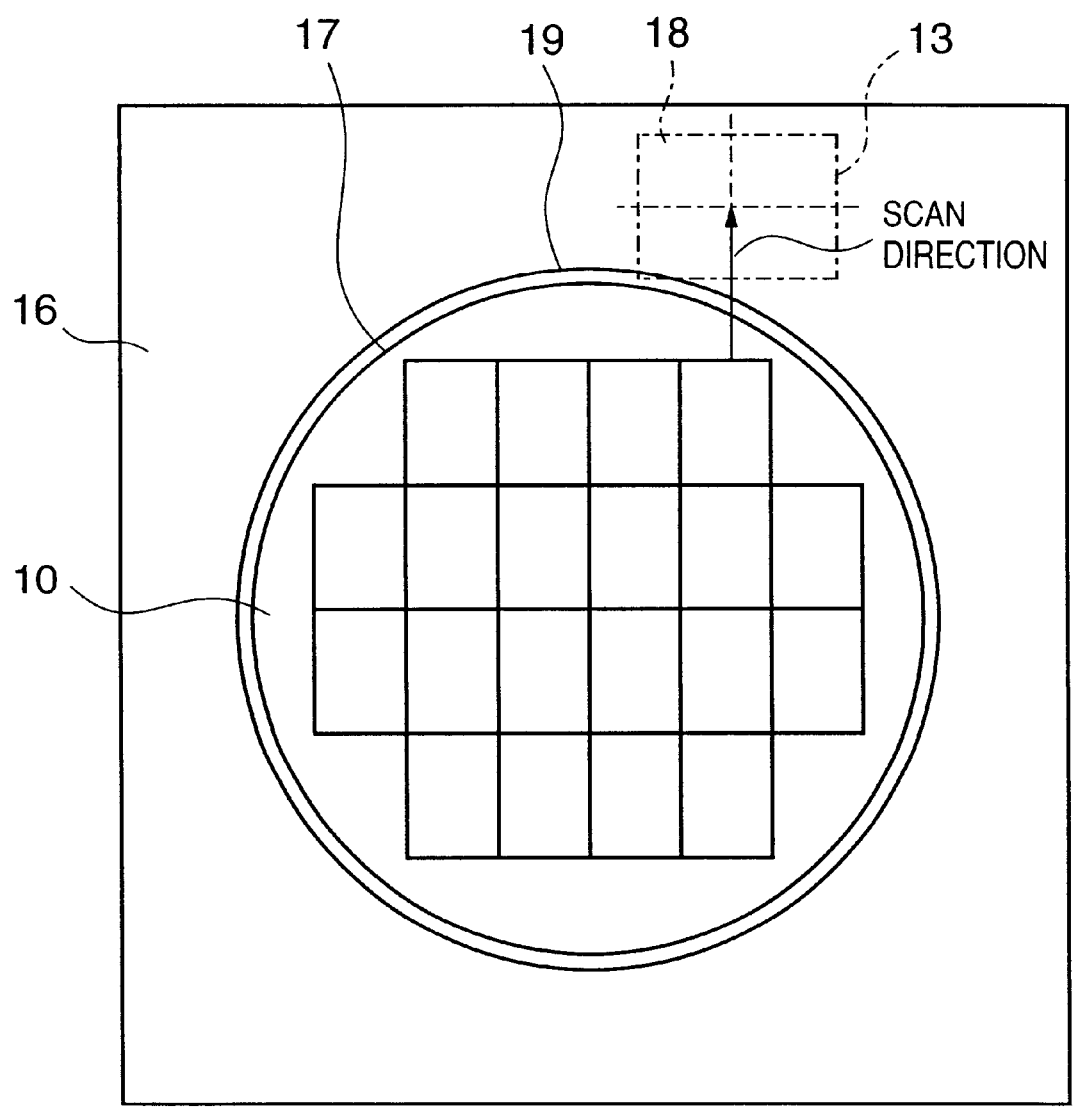
FIG. 30 is a plan view for explaining the structure of the projection exposure apparatus near the wafer according to the other embodiment.

In this stage, the groove-like gap 17, which is a recess with respect to the flow of inert gas, is hardly purged. With oxygen, moisture, or the like left in the groove-like gap 17, the groove-like gap 17 reaches the cover end, as shown in FIG. 19. Then, inert gas flows toward the groove-like gap 17 to purge oxygen, moisture or the like left in the groove-like gap 17. As shown in the plan view of FIG. 30, the groove-like gap 17 is arcuated, so that part of the groove-like gap 17 reaches a cover end 19. After that, the groove-like gap 17 reaches the cover opening 18 across the entire width. Meanwhile, oxygen, moisture, or the like purged from the groove-like gap 17 is partially removed from the groove-like gap 17 to the outside of the cover, but most of them flow up into the cover 13 because of the following reason. When the area facing the opening 18 is much smaller than an opening formed by a gap s2 between the cover 13 and the wafer 10, the resistance is larger, and no substantial flow occurs. Only when the area increases to a given degree, a flow abruptly occurs. At this time, the area facing the opening 18 becomes larger than the sectional area of the groove-like gap 17, and oxygen, moisture, or the like, flows up into the cover 13 at a high ratio.

While oxygen, moisture, or the like, flows up, the wafer 10 reaches an exposure area, and exposure starts. The wafer 10 is exposed while local concentration nonuniformity of oxygen, moisture, or the like, is generated in the cover 13. This may cause illuminance changes or illuminance nonuniformity, failing to obtain a desired resolving power.

The same problem arises not only at the first shot 29 but also in scanning exposure of a shot at the wafer periphery from an outer wafer portion to an inner wafer portion because the groove-like gap similarly moves from the outside to inside of the cover 13 in exposure.

Further, the same problem occurs in scanning exposure of a shot at the wafer periphery from an inner wafer portion to an outer wafer portion because the groove-like gap moves from the outside to inside of the cover 13 in the latter half of exposure.

At a shot at the wafer periphery, oxygen, moisture, or the like, from the groove-like gap 17 between the wafer 10 and the top plate 16 may cause illuminance changes or illuminance nonuniformity, failing to obtain a desired resolving power.

As the diameter of a wafer is increasing for a recent improvement in productivity, the yield of semiconductor elements at the wafer periphery becomes more important. Demands have arisen for the development of an effective purge means for performing stable exposure even at a shot at the wafer periphery as well as a shot at the wafer center.

Detailed arrangement of preferred embodiments of the present invention for satisfactorily purging oxygen moisture, or the like, in the gap 17, will be described below.

Embodiment of Exposure Apparatus

The whole structure of an exposure apparatus according to the present invention will be explained. An exposure apparatus according to a preferred embodiment of the present invention is effective for an ArF excimer laser with a wavelength around far ultraviolet rays, particularly, 193 nm, and a fluorine ($F_2$) excimer laser with a wavelength around 157 nm, though exposure light is not limited to ultraviolet rays.

Preferred embodiments of the present invention will be described below with reference to the accompanying drawings.

First Embodiment

Figure 1:
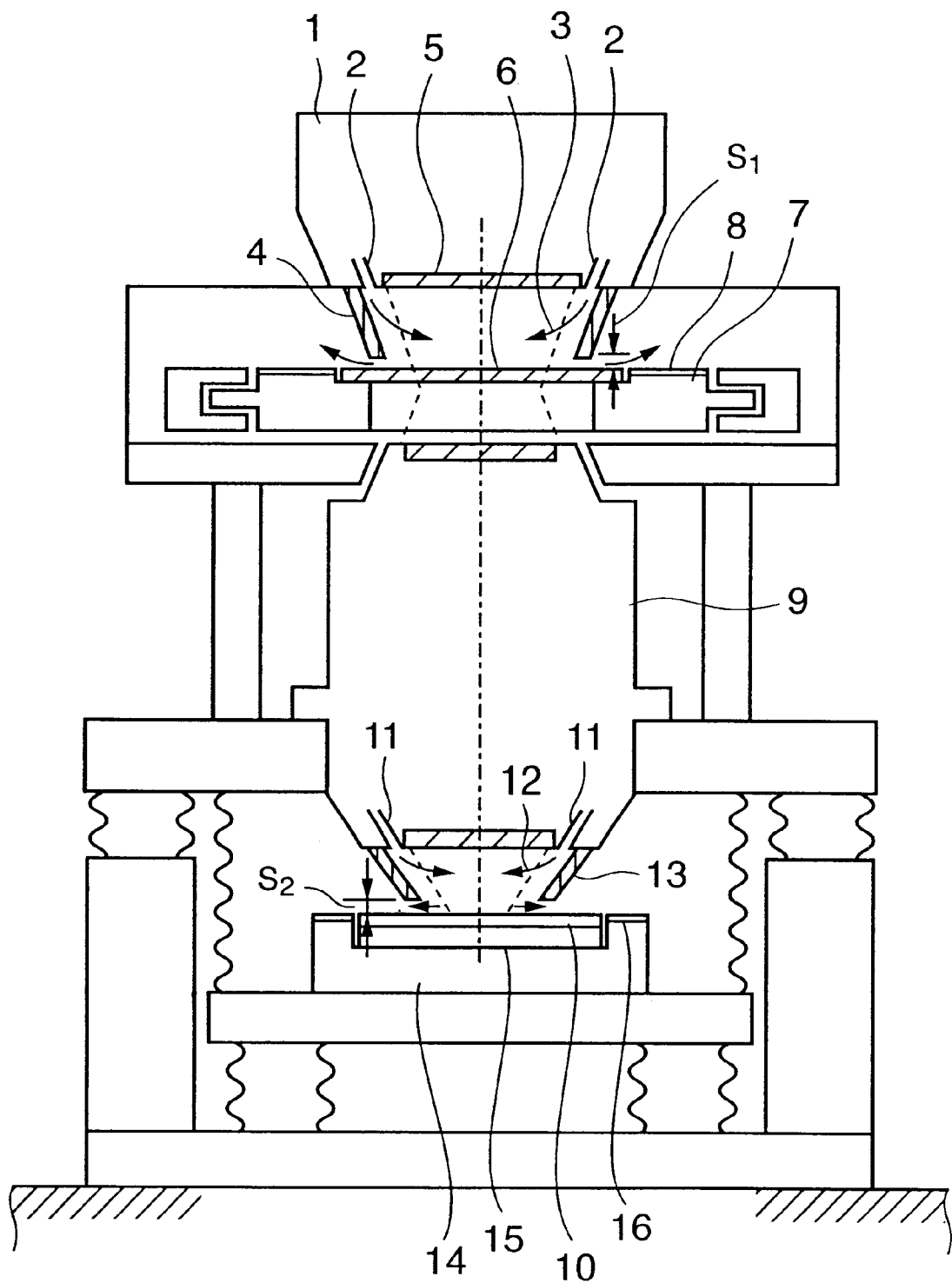
FIG. 1 is a sectional view showing the schematic structure of a projection exposure apparatus according to an embodiment of the present invention.

FIG. 1 shows the main part of a step & scan type projection exposure apparatus according to the first embodiment of the present invention.

In FIG. 1, ultraviolet rays which have reached an illumination optical system 1 in the exposure apparatus from an ultraviolet source (not shown) irradiate a reticle 6 set on a reticle stage 7. A cover 4 for surrounding the ultraviolet path from the reticle-side lower end of the illumination optical system 1 toward the vicinity of the reticle stage 7 is arranged. A plurality of nozzles 2 for supplying purge gas made of inert gas into the cover 4 are formed. The gap between the distal end of the cover 4 and the reticle 6 is s1. Inert gas such as nitrogen, helium, or argon is supplied from the nozzles 2 into the cover 4 to purge an exposure obstacle such as oxygen or moisture.

A top plate 8 is mounted on the reticle stage 7 so as to be flush with the surface of the reticle 6. This prevents the reticle stage 7 from shifting from a portion effectively purged by the cover 4 even if the reticle stage 7 moves by a scan operation.

Ultraviolet rays having passed through the reticle 6 irradiate a wafer 10 on a wafer stage 14 via a projection optical system 9. The projection optical system 9 has a cover 13 for surrounding the ultraviolet path from the wafer-side lower end of the projection optical system 9 toward the vicinity of the wafer stage 14. A plurality of nozzles 11 serving as supply ports for supplying purge gas made of inert gas into the cover 13 are arranged. Inert gas such as nitrogen, helium, or argon is supplied from the projection optical system 9 into the cover 13 via the nozzles 11 to purge an exposure obstacle such as oxygen or moisture. The gap between the distal end of the cover 13 and the wafer 10 is s2.

The gap s2 is desirably as small as possible, which enhances the purge ability inside the cover 13 and decreases the flow rate of purge gas suppled to the cover 13. The gap is, however, required to some degree to avoid contact. In the first embodiment, the gap is set to 1 mm. If the gap s2 is designed to be large, the inside of the cover 13 cannot become a positive pressure with respect to the outside unless the flow rate of purge gas is increased. An exposure obstacle such as oxygen or moisture may flow from the outside, failing in satisfactory purge. Thus, for example, when the flow rate of purge gas supplied into the cover 13 is 50 NL/min, and the total length of the gap s2 is 300 mm, the gap s2 is set to be about 5 mm or less. In this case, the average flow speed from the gap s2 is about 550 mm/s or more, and the interior of the cover 13 becomes a positive pressure and can be sufficiently purged.

A chuck 15 for chucking and holding the wafer 10 as a substrate is mounted on the wafer stage 14. The wafer 10 is loaded by a transfer mechanism (not shown) onto the chuck 15, which chucks and holds the wafer 10. Then, the wafer 10 is unloaded from the chuck 15. A top plate 16 is mounted on the wafer stage 14 so as to be almost flush with the surface of the wafer 10. This prevents the wafer stage 14 from shifting a portion effectively purged by the cover 13 even if the wafer stage 14 moves by a scan operation. Note that the wafer stage 14 and top plate 15 may be integrated. The chuck 15 mounted on the wafer stage 14 to chuck and hold a wafer may be detachable.

Figure 2:
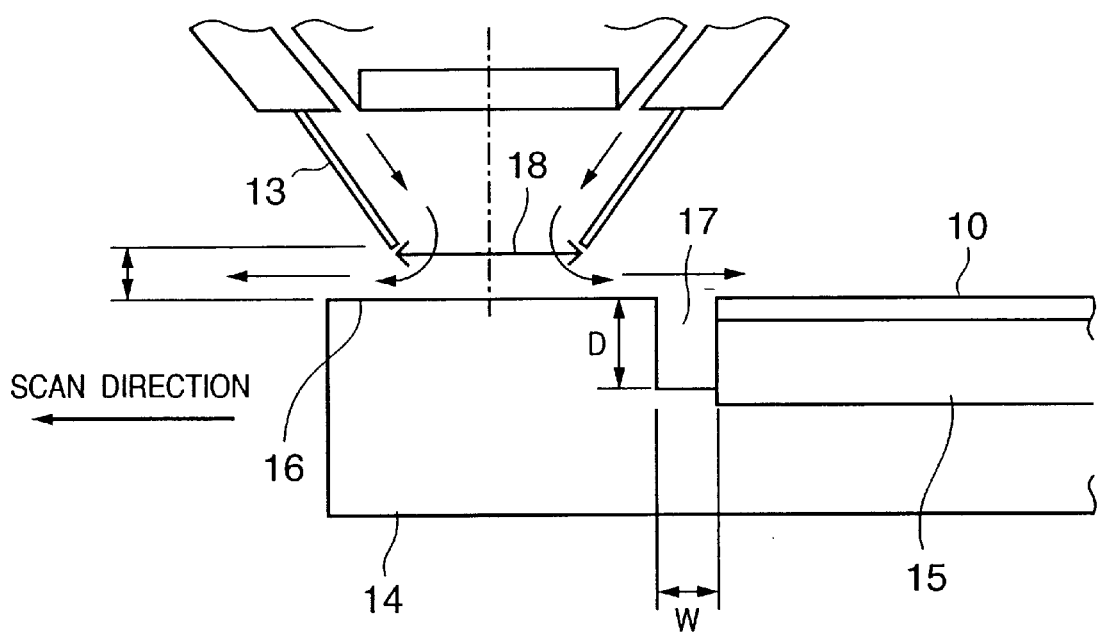
FIG. 2 is a sectional view showing the schematic structure of a projection exposure apparatus near a wafer according to the first embodiment of the present invention.

A groove-like gap 17 shown in FIG. 2 is formed entirely around the wafer between the wafer 10 and the top plate 16 in order to prevent contact between the wafer 10 and the top plate 16, generation of dust, mounting of the wafer 10, or damage to the wafer 10 and top plate 16 depending on the shape tolerance of the wafer 10 and the positional precision of the wafer 10 on the wafer stage 14. The shape tolerance of the wafer 10 varies by about 0.25 to 0.5 mm in radius depending on the grade. Further, considering the roundness, the shape tolerance on the top plate side, and the positional precision of the wafer 10 on the wafer stage 14, a width W of the groovelike gap 17 must be about 1 mm or more. To decrease the capacity in the groove-like gap 17 and the total amount of oxygen, moisture, or the like, the width W of the groove-like gap 17 is desirably as small as about 1 to 2 mm. In this embodiment, the width W is set to be 1 mm.

A depth D of the groove-like gap 17 is set to be larger than at least the width W, and is desirably as large as possible. Since the width W is 1 mm, the depth D must be 1 mm or more, and is set to 10 mm in this embodiment. A deep groove-like gap 17 can prevent oxygen, moisture, or the like, from flowing up into the cover 13 even if the groove-like gap 17 moves below the opening 18, as will be described below.

Figure 3:
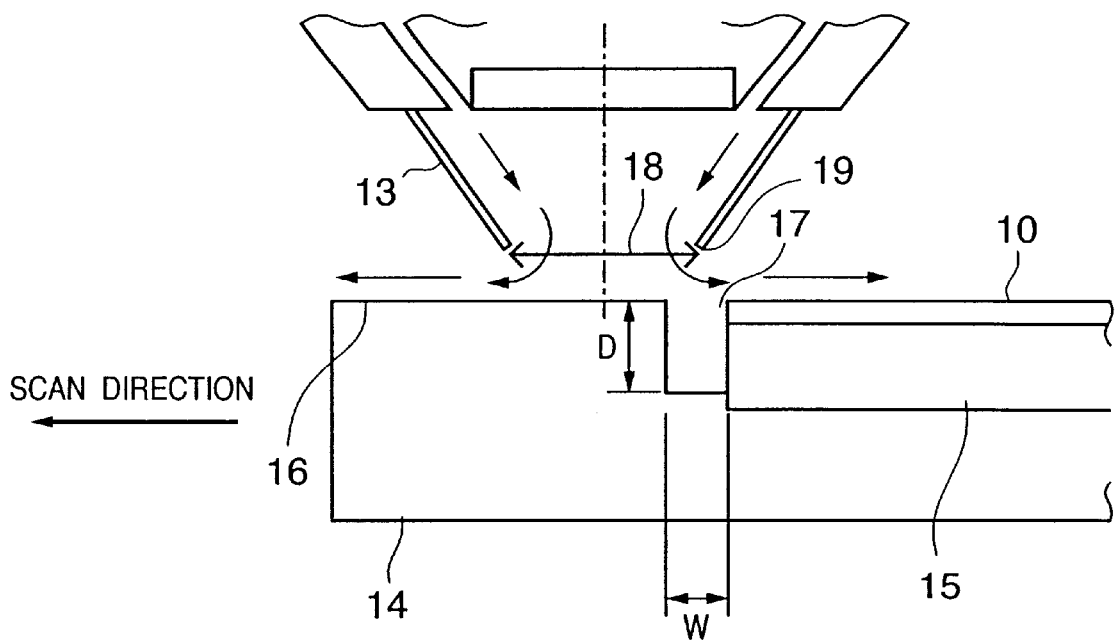
FIG. 3 is a sectional view showing the schematic structure of the projection exposure apparatus near the wafer according to the first embodiment of the present invention.

For example, when a shot at the wafer periphery is to be scanned and exposed from an outer wafer portion to an inner wafer portion, the groove-like gap 17 moves from the outside to inside of the cover 13, as shown in FIG. 2. In this state, the interior of the gap 17 is not satisfactorily purged because the groove-like gap 17 is a recess with respect to the flow of purge gas. With oxygen, moisture, or the like, left in the groove-like gap 17, the groove-like gap 17 reaches the cover end, as shown in. FIG. 3. Then, inert gas flows toward the groove-like gap 17 to purge oxygen, moisture, or the like, left in the groove-like gap 17.

Figure 4:
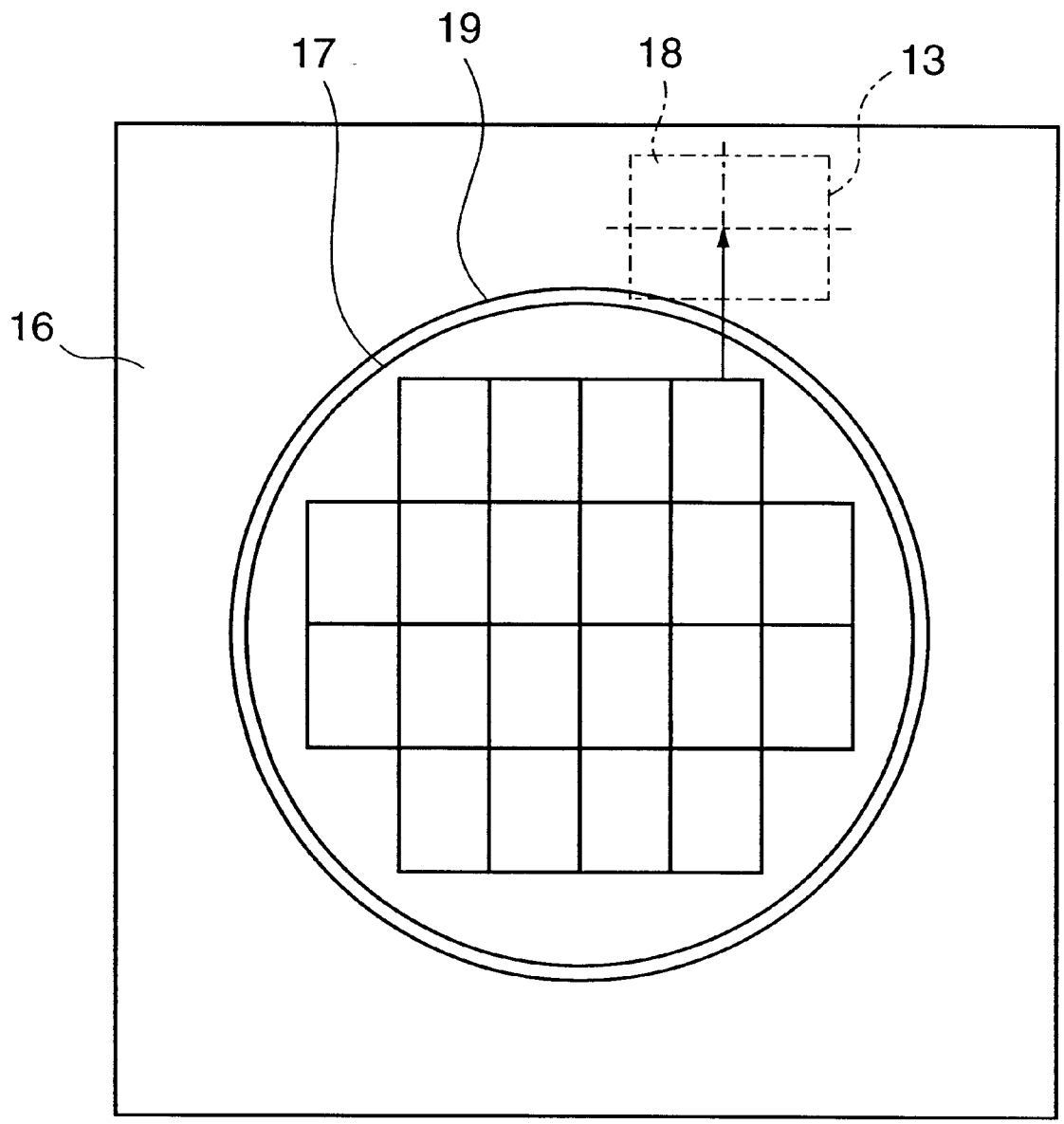
FIG. 4 is a plan view showing the schematic structure of the projection exposure apparatus near the wafer according to the first embodiment of the present invention.
Figure 5:
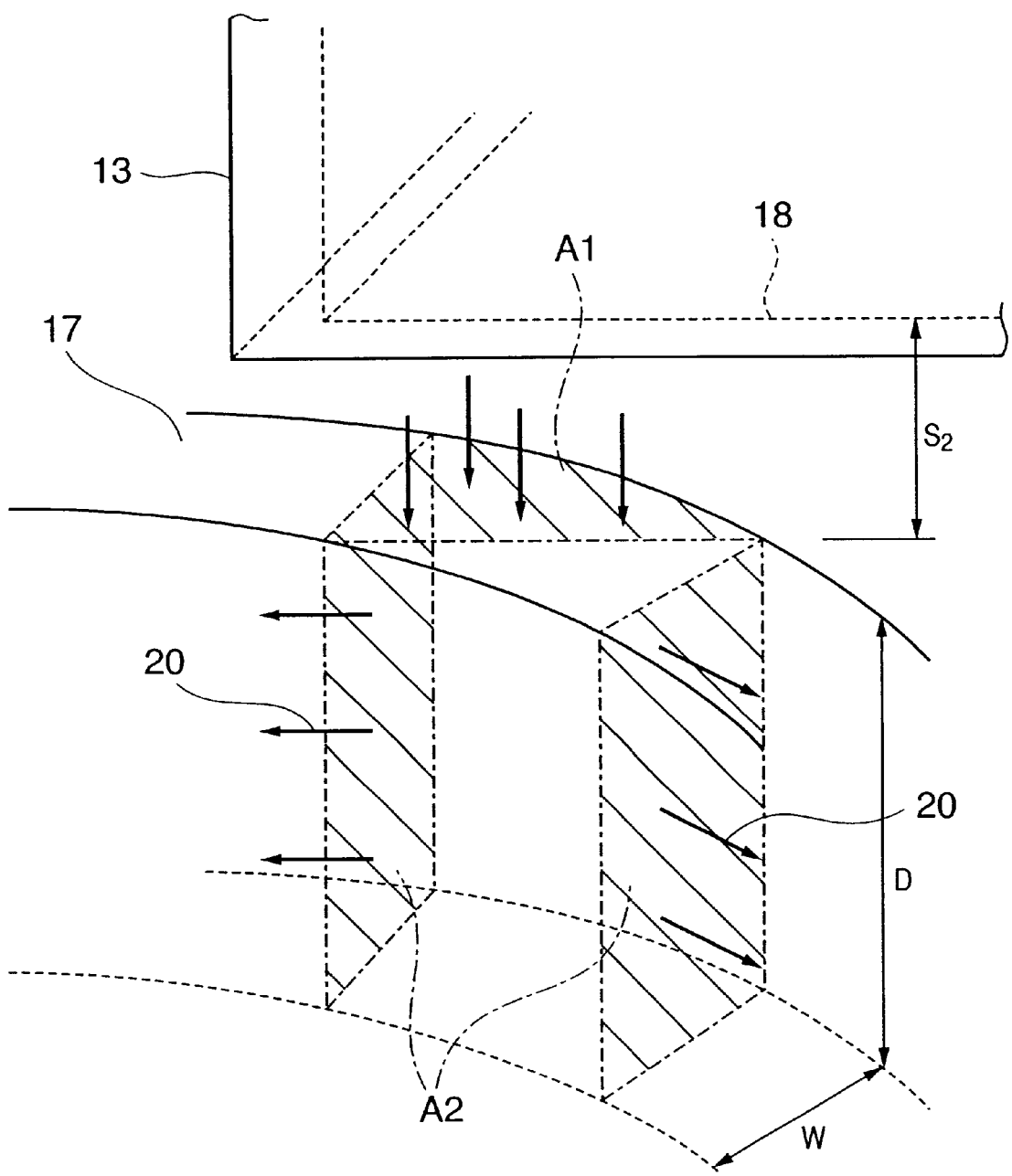
FIG. 5 is an enlarged perspective view showing part of the projection exposure apparatus near the wafer according to the first embodiment of the present invention.

Since the groove-like gap 17 is arcuated along the wafer periphery, only part of the groove-like gap 17 reaches the end 19 of the cover 13, as shown in the plan view of FIG. 4. FIG. 5 is an enlarged perspective view showing this part.

In FIG. 5, an opening area A1 of the groove-like gap 17 to the cover opening 18 (i.e., the area of a portion where the cover opening overlaps the gap 17 when the cover opening is vertically projected) increases with the movement of the wafer stage 14. As the opening area A1 increases, purge gas flows toward the groove-like gap 17. If the opening area A1 is much smaller than an opening formed by the gap s2, the resistance is large, and purge gas does not flow into the groove-like gap 17 but horizontally flows to the outside of the cover 13.

If the opening area A1 increases to be s2×s2 about 1 mm², as shown in FIG. 5, purge gas starts to flow into the gap 17 to purge oxygen, moisture, or the like, left in the groove-like gap 17. A sectional area A2 of the groove-like gap 17 (sectional area of the vertical plate of the gap 17) is 20 mm² including right and left areas. At the start of the flow, the sectional area A2 is larger than the opening area A1 by about twenty times. Hence, most of the flow of oxygen, moisture, or the like purged from the groove-like gap 17 serves as a flow 20 purged from the sectional area A2 to the outside of the cover 13. Almost no flow toward the cover 13 is generated. This process continues until the opening area A1 reaches about 20 mm². Meanwhile, the flow 20 is formed along the groove-like gap 17 toward the outside of the cover 13 through the sectional area A2.

Purge gas is supplied from the nozzles 11 into the cover 13 so as to obtain a flow speed ten times or more a scan speed of 0.1 to 0.5 m/s. The flow speed becomes higher than the moving speed of the sectional area A2 to form the flow 20 of purge gas from the inside to outside of the cover 13 through the sectional area A2. Oxygen, moisture, or the like, left in the groove-like gap 17 is purged to the outside of the cover 13. The interior of the groove-like gap 17 outside the cover 13 is purged in advance with purge gas.

Thereafter, the groove-like gap 17 comes to the opening 18 across the entire width. During this, the flow 20 of purge gas is formed from the inside to outside of the cover 13 through the sectional area A2. This cuts off entrance of oxygen, moisture, or the like, from the outside to inside of the cover 13.

This structure can substantially prevent oxygen, moisture, or the like, left in the groove-like gap 17 from flowing up into the cover 13. Exposure can be executed without any local concentration nonuniformity of oxygen, moisture, or the like, in the cover 13. A desired resolving power can be obtained without any illuminance changes or illuminance nonuniformity. Even a shot at the wafer periphery can be stably exposed as well as a shot at the wafer center.

The top plate 16 is almost flush with the surface of the wafer 10 in the above description, but may slightly shift from it. The gap between the distal end of the cover 13 and the wafer 10 or top plate 17 can be satisfactorily purged as far as the gap is about 5 mm or less, as described above. The gap s2 may be designed to be 1 mm, and the gap s3 between the distal end of the cover 13 and the top plate 16 may be to 5 mm. Alternatively, the gaps s2 and s3 may. be designed to 5 mm and 1 mm, respectively. Alternatively, the gaps s2 and s3 may be designed to intermediate values. As the gap is larger, purge of oxygen, moisture, or the like, left in the groove-like gap 17 starts with a delay. The opening area A1 at the start of the purge comes close to the section area A2. The ratio of a flow toward the outside of the cover 13 through the section area A2 decreases, and the ratio of a flow toward the inside of the cover 13 increases. To prevent this, the depth of the groove-like gap is desirably made as large as possible. The depth D of the groove-like gap is set to be larger than at least the width W. This setting can ensure a high ratio of the flow toward the outside of the cover 13 through the sectional area A2 to the flow toward the inside of the cover 13. The same effects can be attained.

Scanning exposure of a shot at the wafer periphery from an outer wafer portion to an inner wafer portion has been described. The same effects as those described above can be obtained even in scanning exposure of a shot at the wafer periphery reversely from an inner wafer portion to an outer wafer portion though the groove-like gap 17 moves from the outside to inside of the cover 13 in the latter half of exposure.

Figure 6:
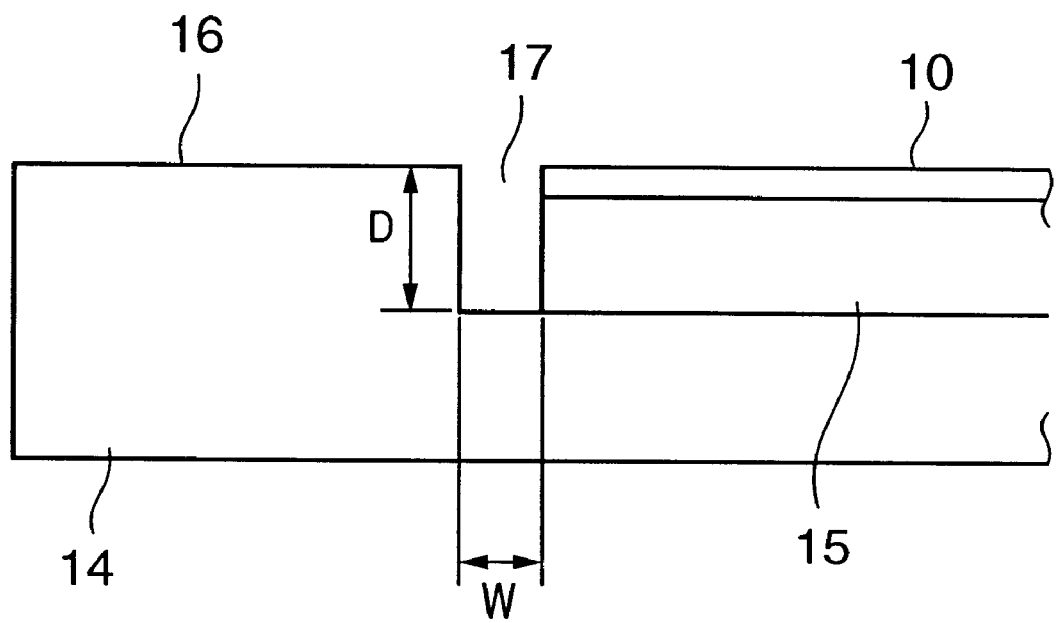
FIG. 6 is a sectional view showing the schematic structure of the projection exposure apparatus near the wafer according to the first embodiment of the present invention.

The groove-like gap 17 is desirably formed deeply to the chuck support surface, as shown in FIG. 6. This facilitates detachment of the chuck 15 from the wafer stage 14 for chuck cleaning or the like.

The width of the gap beside the wafer need not always be equal to that beside the chuck 15. The shape of the chuck need not always be identical to that of the wafer. Even if either the chuck or wafer is larger, the same effects can be obtained.

The exposure apparatus according to the first embodiment can remove impurities in the optical path of a fluorine gas laser beam even with the use of the fluorine gas laser beam as exposure light while ensuring a satisfactory transmittance and stability during exposure across the wafer.

Second Embodiment

Figure 7:
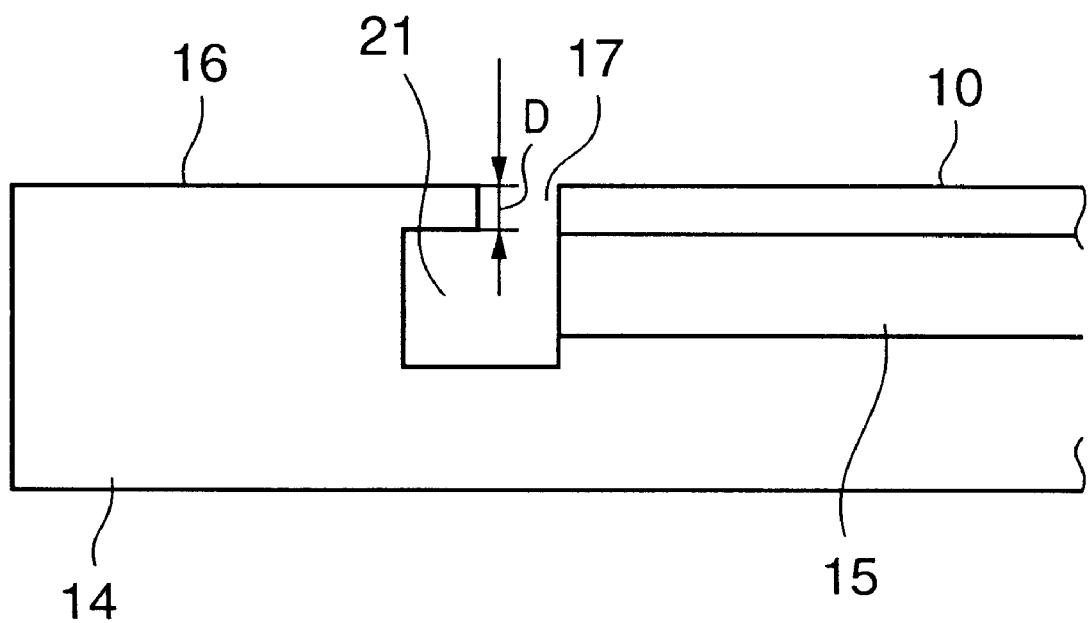
FIG. 7 is a sectional view showing the schematic structure of a projection exposure apparatus near a wafer according to the second embodiment of the present invention.

FIG. 7 shows an embodiment in which a vent hole 21 is formed as a larger space below a groove-like gap 17 between a wafer 10 and a top plate 16 in the first embodiment. The width between the wafer 10 and the top plate 16 is smaller than the width between the side surface of the chuck and the internal side surface of the top plate.

The second embodiment can realize a large sectional area A2. The sectional area A2 is much larger than the opening area A1 when the groove-like gap 17 moves from the outside to inside of a cover 13 to communicated with the opening 18, and oxygen, moisture, or the like, left in the groove-like gap 17 starts to be purged.

Almost all of the flow oxygen, moisture, or the like, purged from the groove-like gap 17 temporarily flows into the vent hole 21 without any resistance, and is purged to the outside of the cover 13 through the sectional area A2. Almost no flow into the cover 13 occurs. If the interior of the vent hole 21 is not completely purged, the flow of purge gas from the inside of the cover 13 to the vent hole 21 is formed in the groove-like gap 17. This flow cuts off entrance of oxygen, moisture, or the like, from the vent hole into the cover 13.

This structure can substantially prevent oxygen, moisture, or the like, from flowing up from the groove-like gap 17. Exposure can be done without any local concentration nonuniformity of oxygen, moisture, or the like, in the cover 13. A desired resolving power can be obtained without any illuminance changes or illuminance nonuniformity. Even a shot at the wafer periphery can be stably exposed as well as a shot at the wafer center.

In the second embodiment, the depth D of the groove-like gap need not be equal to the thickness of the wafer 10, and may be larger or smaller. The depth D is desirably smaller because the capacity of the groove-like gap 17 itself decreases, the total amount of oxygen, moisture, or the like, decreases, the resistance of a flow to the vent hole 21 decreases, and a flow into the cover 13 hardly occurs. Even a large depth D yields the same effects as far as the vent hole 21 is larger in volume than the groove-like gap 17.

Figure 8:
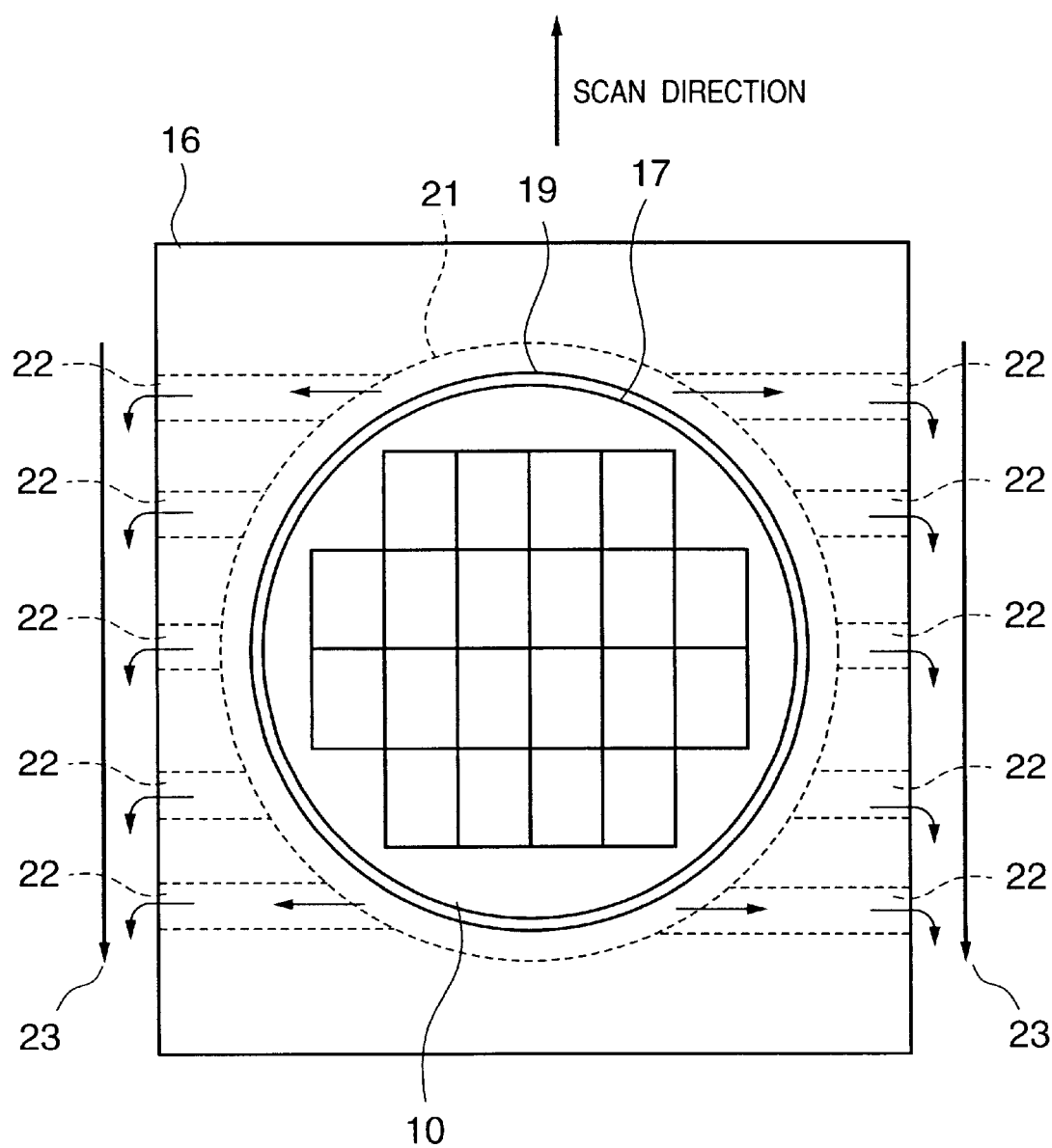
FIG. 8 is a plan view showing the schematic structure of the projection exposure apparatus near the wafer according to a modification of the second embodiment of the present invention.

The vent hole 21 may communicate with a plurality of openings 22 formed in the side surface of a wafer stage 14, as shown in FIG. 8. The openings 22 may be formed at any position in a surface almost parallel to a scan direction at about 30° or less with respect to the scan direction. During scan, an airflow 23 moves almost parallel to the surface having the openings 22 along with relative movement of the openings 22 to the peripheral gas. As a result, the airflow side 23 becomes a negative pressure. Gas inside the openings 22 is discharged to the outside, forming a flow from the vent hole 21 to the openings 22. This flow is promoted by discharge from the vent hole 21 to the openings 22 when the groove-like gap 17 moves from the outside to inside of the cover 13 to communicate with the opening 18, and oxygen, moisture, or the like, left in the groove-like gap 17 is purged to the vent hole. Accordingly, a flow into the cover 13 hardly occurs.

Also, in the second embodiment, the top plate 16 is desirably almost flush with the surface of the wafer 10, which enhances the purge ability and decreases the flow rate of purge gas. However, the surface of the top plate 16 may slightly shift from that of the wafer 10. The gap between the distal end of the cover 13 and the wafer 10 or top plate 16 can be satisfactorily purged as far as the gap is about 5 mm or less. A gap s2 may be designed to 1 mm, and a gap s3 between the distal end of the cover 13 and the top plate 16 may be designed to 5 mm. Alternatively, the gaps s2 and s3 may be designed to 5 mm and 1 mm, respectively. Alternatively, the gaps s2 and s3 may be designed to intermediate values.

The groove-like gap 17 is desirably formed deeply to the chuck support surface, as shown in FIG. 7. This facilitates detachment of a chuck 15 from the wafer stage 14 for chuck cleaning or the like.

Figure 9:
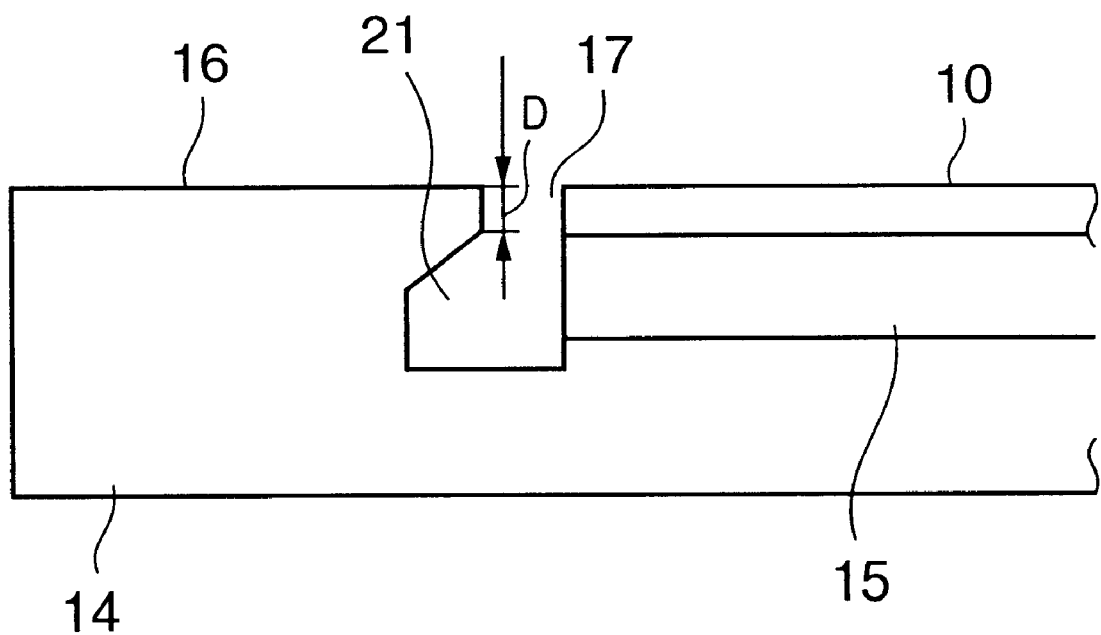
FIG. 9 is a sectional view showing the schematic structure of the projection exposure apparatus near the wafer according to another modification of the second embodiment of the present invention.

The sectional shape of the vent hole is not limited to the above-mentioned shape, and can be arbitrarily designed to, e.g., a shape which facilitates a flow, as shown in FIG. 9. The shape of the chuck need not always be identical to that of the wafer. Even if either the chuck or wafer is larger, the same effects can be obtained.

The exposure apparatus according to the second embodiment can remove impurities in the optical path of a fluorine gas laser beam even with the use of the fluorine gas laser beam as exposure light while ensuring a satisfactory transmittance and stability during exposure across the wafer.

Third Embodiment

Figure 10:
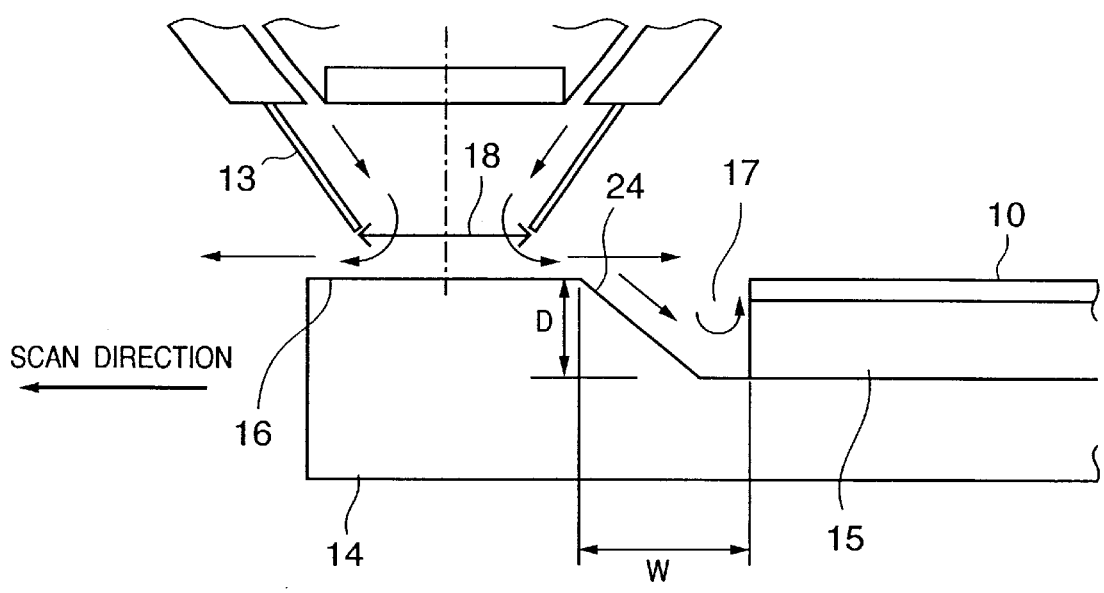
FIG. 10 is a sectional view showing the schematic structure of a projection exposure apparatus near a wafer according to the third embodiment of the present invention.

FIG. 10 shows another embodiment in which the section of a groove-like gap 17 between a wafer 10 and a top plate 16 is shaped into an inclined surface 24 on the top plate side. In other words, in the third embodiment, an inclined surface not perpendicular to the wafer surface, more specifically, a surface inclined from the outer side to inner side of the top plate is formed on the side surface of a step between the surface of the top plate and the bottom of the gap formed between the wafer 10 and the top plate 16.

The groove-like gap 17 is purged with the flow of purge gas from a gap s2 between the cover 13 and the top plate 16 before the groove-like gap 17 moves from the outside to inside of a cover 13 to communicate with a cover opening 18. The groove-like gap 17 reaches the opening 18 with almost no oxygen, moisture, or the like, in the groove-like gap 17. Even if a flow into the cover 13 occurs at that time, it hardly causes a problem.

In the third embodiment, it is preferable that the depth D of the groove-like gap be as small as possible, the width W be large, and the inclination of the inclined surface 24 be gradual. For this purpose, the groove-like gap 17 is made shallow such that its bottom is almost flush with the wafer chuck surface of a chuck 15. The bottom is made smooth without any projection, unlike the wafer chuck surface. Further, the chuck 15 is buried such that its side surface is in tight contact with the side surface of a circular recess formed in a wafer stage 14 without or with the mediacy of an elastic member so as not to form any gap between the side surface of the chuck 15 and the top plate 16. The chuck 15 can be separated/detached from the wafer stage 14.

The sectional shape of the inclined surface 24 is not defined by one oblique line, but may be defined by a combination of curves, horizontal lines, vertical lines, and oblique lines as far as the inclined surface 24 gradually becomes deeper with smoothness to facilitate a flow.

Figure 12:
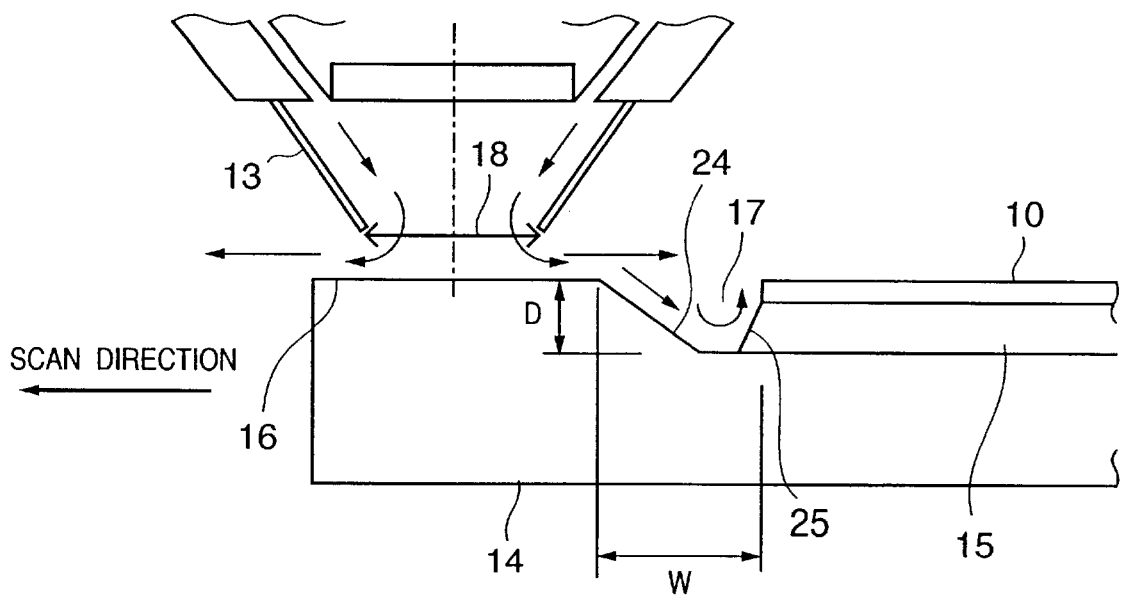
FIG. 12 is a sectional view showing the schematic structure of the projection exposure apparatus near the wafer according to the third embodiment of the present invention.

The groove-like gap 17 is desirably formed deeply to the chuck support surface, as shown in FIG. 10. This facilitates detachment of the chuck 15 from the wafer stage 14 for chuck cleaning or the like. Since the step becomes higher, the chuck 15 is preferably as thin as about 1.5 to 3 mm. Alternatively, an inclined surface 25 identical to that of the top plate side may be formed on the side surface of the chuck 15, as shown in FIG. 12, so as to make purge gas striking the side surface of the chuck 15 smoothly flow above the wafer 10. In this case, the gap 17 is further purged.

In the third embodiment, the top plate 16 may be almost flush with the surface of the wafer 10. However, the top plate surface is desirably set at a lower level than the wafer surface, which moderates the inclination of the inclined surface. The gap between the distal end of the cover 13 and the wafer 10 or top plate 16 can be satisfactorily purged as far as the gap is about 5 mm or less. The gap s2 may be designed to be 1 mm, and a gap s3 between the distal end of the cover 13 and the top plate 16 may be designed to be 5 mm. Alternatively, the gaps s2 and s3 may be designed to be 5 mm and 1 mm, respectively. Alternatively, the gaps s2 and s3 may be designed to be intermediate values.

The exposure apparatus according to the third embodiment can remove impurities in the optical path of a fluorine gas laser beam even with the use of the fluorine gas laser beam as exposure light while ensuring a satisfactory transmittance and stability during exposure across the wafer.

Fourth Embodiment

Figure 13:
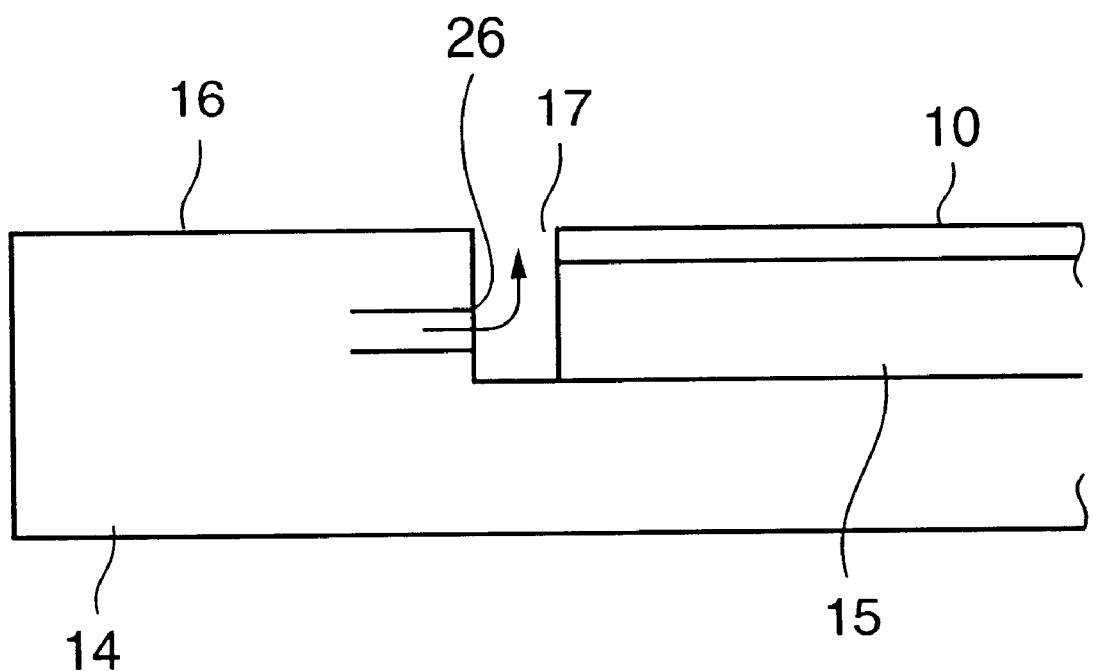
FIG. 13 is a sectional view showing the schematic structure of a projection exposure apparatus near a wafer according to the fourth embodiment of the present invention.

FIG. 13 shows an embodiment which adopts a plurality of supply ports 26 for supplying purge gas into a groove-like gap 17 between a wafer 10 and a top plate 16. Purge gas from the supply ports 26 substantially removes oxygen, moisture, or the like, from the groove-like gap 17. Even if the groove-like gap 17 reaches the interior of a cover 13 and a flow into the cover 13 occurs, this flow hardly poses any problem. Purge gas to the supply ports 26 is supplied from a purge gas supply source (not shown) disposed outside a wafer stage 14 to the supply ports 26 via a movable pipe (not shown).

To suppress the consumption amount of purge gas, supply of purge gas from the supply ports 26 is stopped by a means (not shown) except during an exposure sequence. Alternatively, purge gas may be supplied only when a short at the periphery of the wafer 10 is to be exposed during an exposure sequence. To expose a farther shot at the wafer periphery, purge gas can be supplied only from a supply port 26 in the groove-like gap 17 that faces the farther side of the wafer. To expose a nearer shot at the wafer periphery, purge gas can be supplied only from a supply port 26 in the groove-like gap 17 that faces the nearer side of the wafer.

Also, in the fourth embodiment, the top plate 16 is desirably almost flush with the surface of the wafer 10, which enhances the purge ability and decreases the flow rate of purge gas. However, the surface of the top plate 16 may slightly shift from that of the wafer 10. The gap between the distal end of the cover 13 and the wafer 10 or top plate 16 can be satisfactorily purged as far as the gap is about 5 mm or less. A gap s2 may be designed to be 1 mm, and a gap s3 between the distal end of the cover 13, and the top plate 16 may be designed to be 5 mm. Alternatively, the gaps s2 and s3 may be designed to be 5 mm and 1 mm, respectively. Alternatively, the gaps s2 and s3 may be designed to be intermediate values.

The groove-like gap 17 is desirably formed deeply to the chuck support surface, as shown in FIG. 13. This facilitates detachment of a chuck 15 from the wafer stage 14 for chuck cleaning or the like.

The exposure apparatus according to the fourth embodiment can remove impurities in the optical path of a fluorine gas laser beam even with the use of the fluorine gas laser beam as exposure light while ensuring a satisfactory transmittance and stability during exposure across the wafer.

Fifth Embodiment

Figure 14:
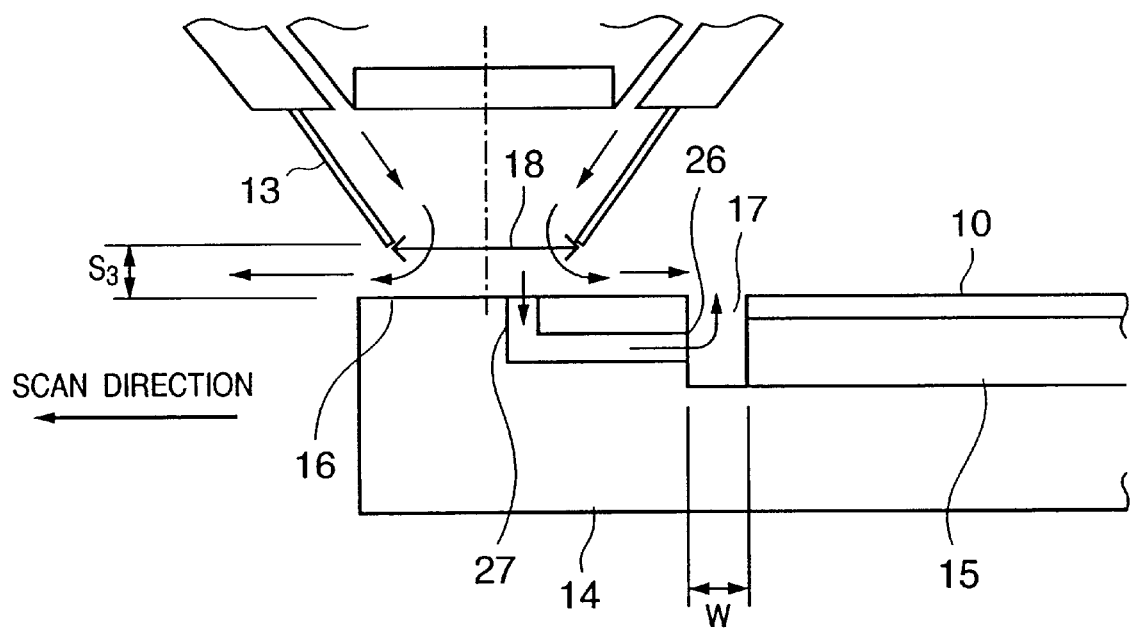
FIG. 14 is a sectional view showing the schematic structure of a projection exposure apparatus near a wafer according to the fifth embodiment of the present invention.

FIG. 14 shows an embodiment in which a plurality of supply ports 26 communicate with the surface of a top plate 16 via a plurality of vent holes 27 in order to prevent consumption of purge gas into a groove-like gap 17 in the fourth embodiment.

According to the fourth embodiment, the groove-like gap 17 moves from the outside to inside of a cover 13 in scanning exposure of a shot at the wafer periphery from the wafer periphery to an inner wafer portion. Before the groove-like gap 17 communicates with a cover opening 18, the cover opening 18 reaches the openings of the vent holes 27 formed in the surface of the top plate 16. Then, purge gas flows from the cover 13 to the supply ports via the vent holes 27 to purge the groove-like gap 17. Oxygen, moisture, or the like, is substantially removed from the groove-like gap 17 until the groove-like gap 17 reaches the cover opening 18. Hence, if a flow into the cover 13 occurs, it hardly causes a problem.

In scanning exposure of a shot at the wafer periphery reversely from an inner wafer portion to the wafer periphery, the groove-like gap 17 moves from the outside to inside of the cover 13 in the latter half of exposure. The groove-like gap 17 first reaches the cover opening 18. At this time, purge gas reversely flows from the supply ports 26 via the vent holes 27 to purge oxygen, moisture, or the like. Compared to the first embodiment, oxygen, moisture, or the like, can be further prevented from flowing up from the groove-like gap 17 into the cover 13.

Also, in the fifth embodiment, the top plate 16 is desirably almost flush with the surface of the wafer 10, which enhances the purge ability and decreases the flow rate of purge gas. However, the surface of the top plate 16 may slightly shift from that of the wafer 10. The gap between the distal end of the cover 13 and the wafer 10 or top plate 16 can be satisfactorily purged as far as the gap is about 5 mm or less. A gap s2 may be designed to be 1 mm, and a gap s3 between the distal end of the cover 13 and the top plate 15 may be set to be 5 mm. Alternatively, the gaps s2 and s3 may be designed to be 5 mm and 1 mm, respectively. Alternatively, the gaps s2 and s3 may be designed to be intermediate values.

The groove-like gap 17 is desirably formed deeply to the chuck support surface, as shown in FIG. 14. This facilitates detachment of a chuck 15 from the wafer stage 14 for chuck cleaning or the like.

The exposure apparatus according to the fifth embodiment can remove impurities in the optical path of a fluorine gas laser beam even with the use of the fluorine gas laser beam as exposure light while ensuring a satisfactory transmittance and stability during exposure across the wafer.

Sixth Embodiment

FIGS. 15 to 22 show the sixth embodiment. In the first to fifth embodiments described above, the top plate surface is almost flush with the wafer surface. In the sixth embodiment, a gap 17 has a sectional shape as those described in the first to fifth embodiments, and the top plate surface is formed to be flush with the surface of a chuck 15 or at a lower level. The remaining structure is the same as those in the first to fifth embodiments, and a description of constituent elements will be omitted.

Figure 11:
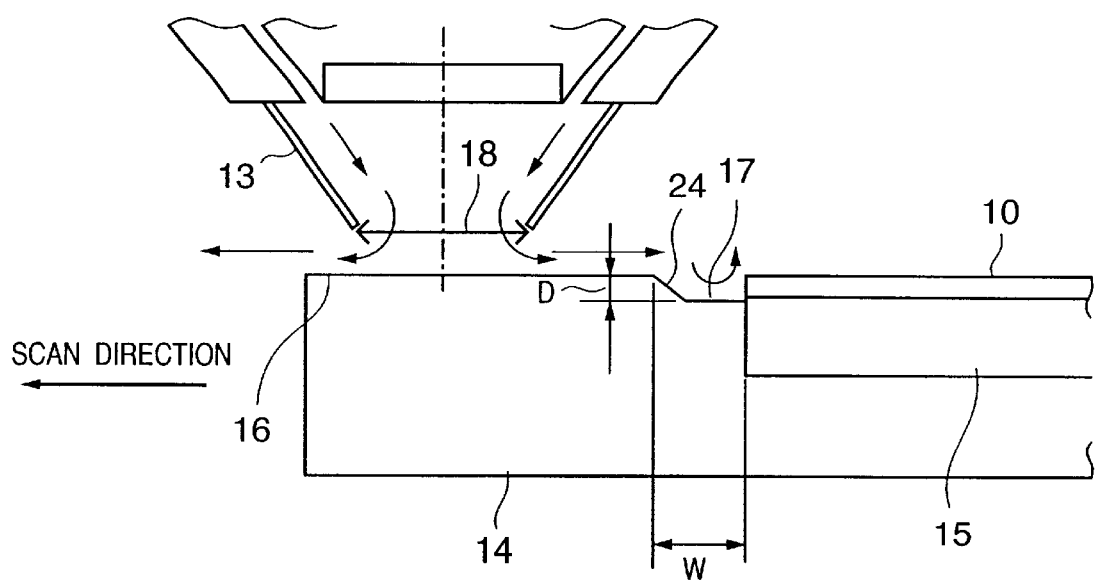
FIG. 11 is a sectional view showing the schematic structure of the projection exposure apparatus near the wafer according to the third embodiment of the present invention.
Figure 15:
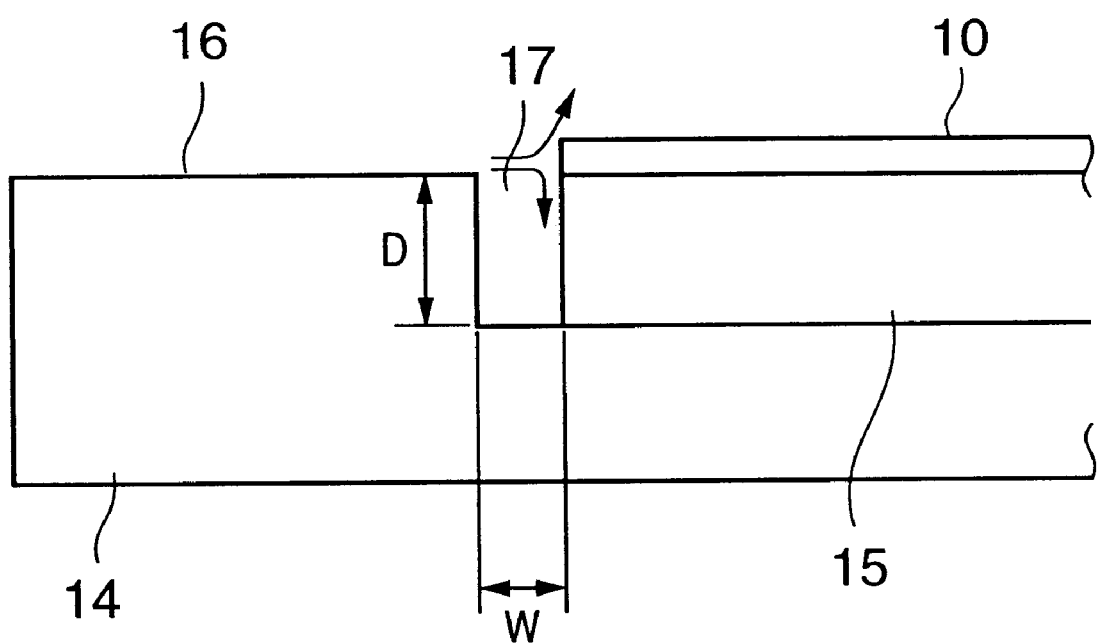
FIG. 15 is a sectional view showing the schematic structure of a projection exposure apparatus near a wafer according to the sixth embodiment of the present invention.
Figure 16:
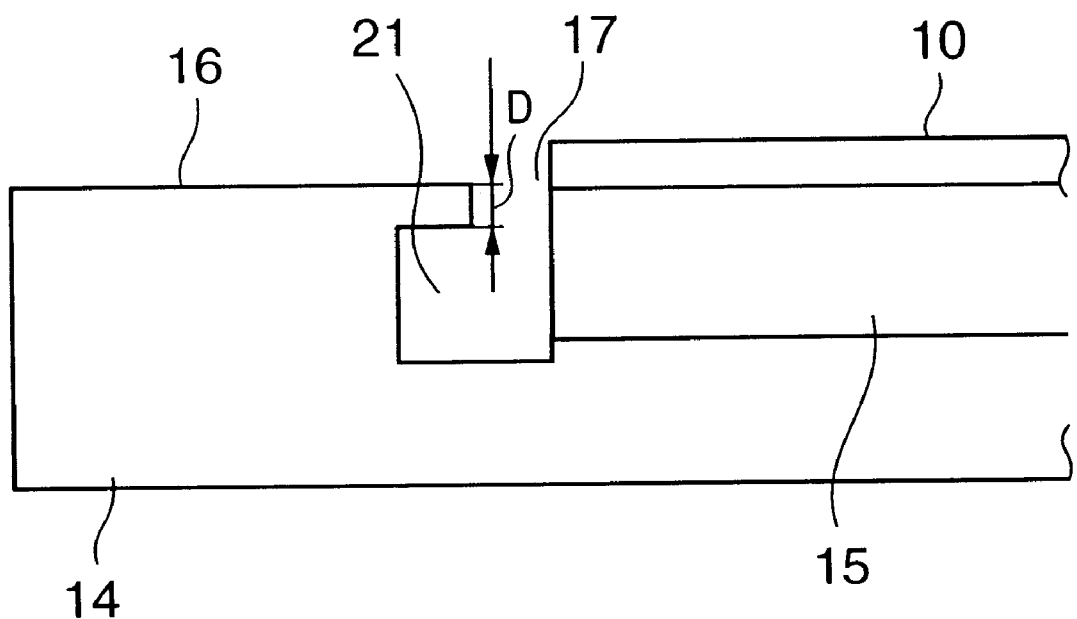
FIG. 16 is a sectional view showing the schematic structure of the projection exposure apparatus near the wafer according to the sixth embodiment of the present invention.
Figure 17:
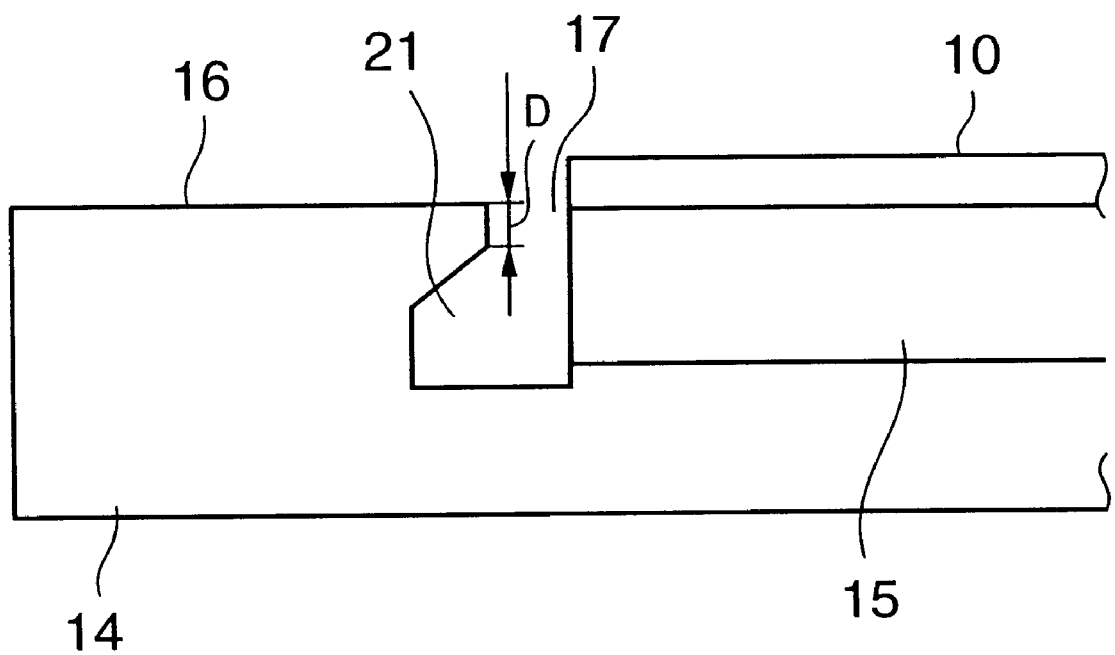
FIG. 17 is a sectional view showing the schematic structure of the projection exposure apparatus near the wafer according to the sixth embodiment of the present invention.
Figure 18:
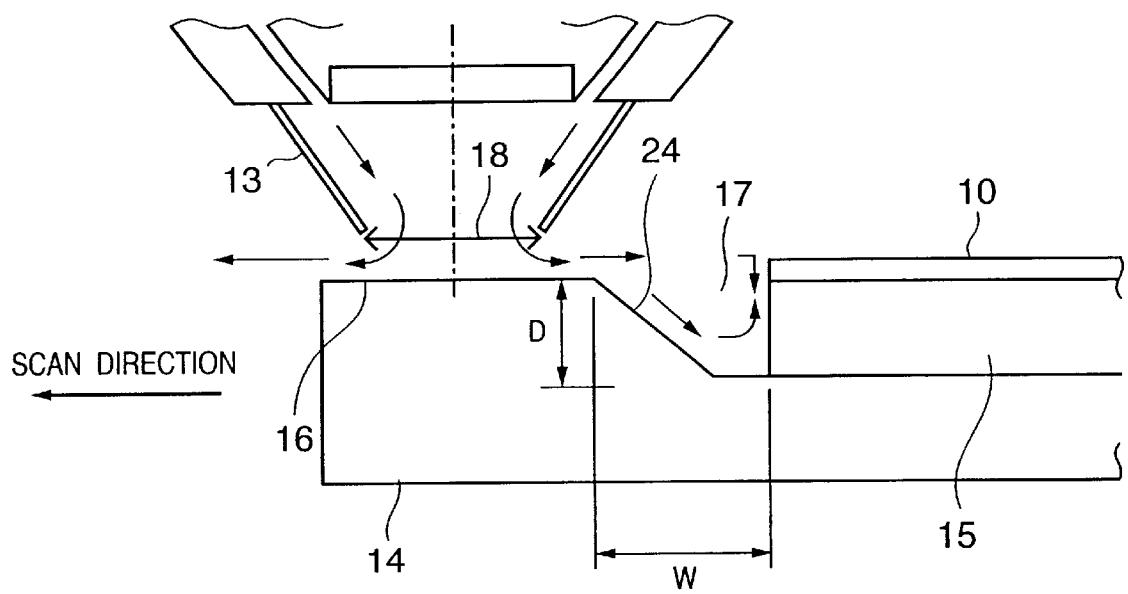
FIG. 18 is a sectional view showing the schematic structure of the projection exposure apparatus near the wafer according to the sixth embodiment of the present invention.
Figure 20:
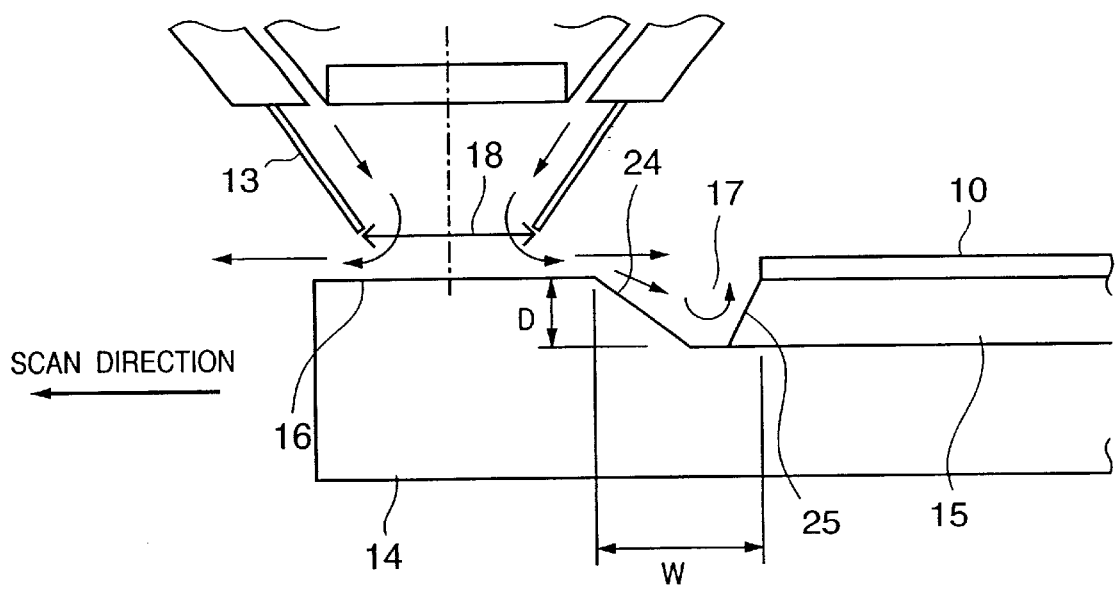
FIG. 20 is a sectional view showing the schematic structure of the projection exposure apparatus near the wafer according to the sixth embodiment of the present invention.
Figure 21:
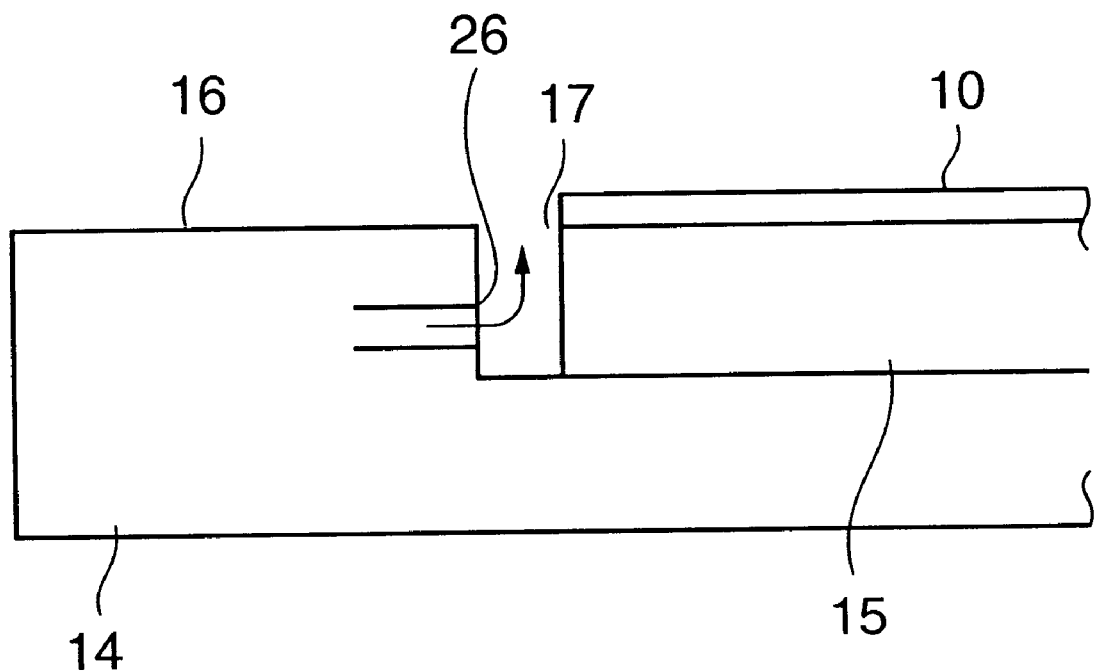
FIG. 21 is a sectional view showing the schematic structure of the projection exposure apparatus near the wafer according to the sixth embodiment of the present invention.
Figure 22:
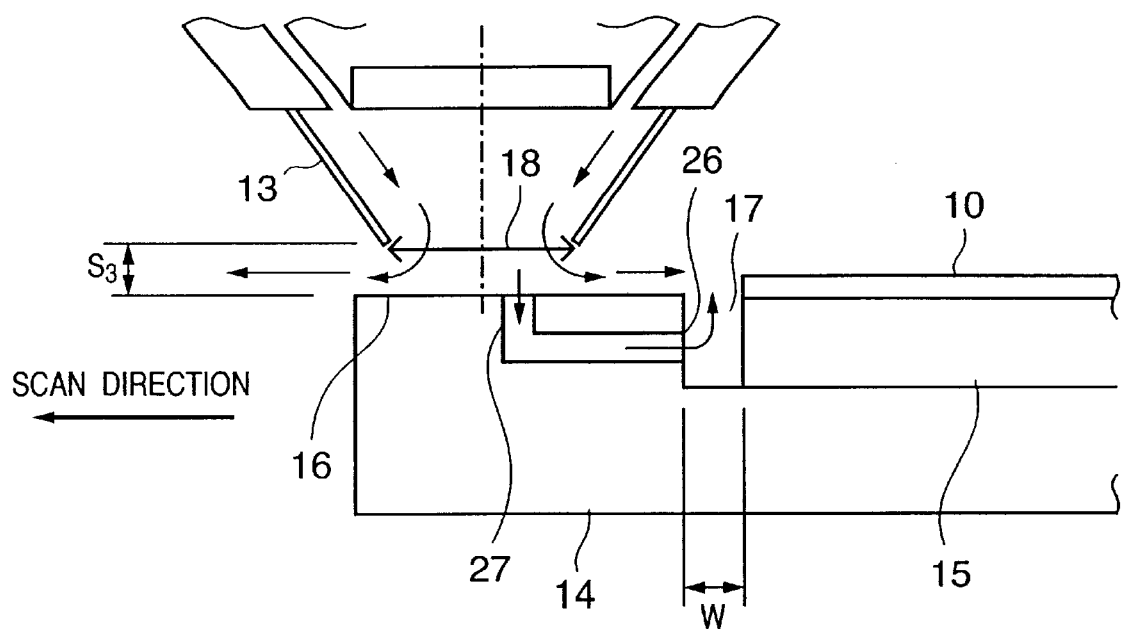
FIG. 22 is a sectional view showing the schematic structure of the projection exposure apparatus near the wafer according to the sixth embodiment of the present invention.

FIG. 15 shows a modification of the first embodiment shown in FIG. 2. FIG. 16 shows a modification of the second embodiment shown in FIG. 7. FIGS. 18 to 20 show a modification of the third embodiment shown in FIGS. 10 to 12. FIG. 21 shows a modification of the fourth embodiment shown in FIG. 13. FIG. 22 shows a modification of the fifth embodiment shown in FIG. 14.

According to the sixth embodiment, a flow of purge gas from a gap s2 between a cover 13 and a top plate 16 strikes the side surface of a wafer 10 before the groove-like gap 17 reaches a cover opening 18 (see, e.g., FIG. 15). The flow is split into a flow onto the surface of the wafer 10 and a flow toward the groove-like gap 17. Purge gas is positively supplied into the groove-like gap 17. This purge gas greatly reduces oxygen, moisture, or the like, until the groove-like gap 17 reaches the cover opening 18. The amount of oxygen, moisture, or the like, into the cover 13 can be further decreased.

The width of the groove-like gap 17 is not limited by the shape tolerance of the wafer 10 or the positional precision of the wafer 10 set on a wafer stage 14. By suppressing the shape tolerances of the chuck 15 and top plate 15, the width W of the groove-like gap can be set to be smaller. As a result, the capacity of the groove-like gap 17 decreases, and the total amount of oxygen, moisture, or the like, decreases, reducing the amount of oxygen, moisture, or the like, into the cover 13. In the third embodiment, the top plate 16 is at a low level, which also decreases the volume of the groove-like gap 17.

In the embodiment shown in FIGS. 18 to 20 (modification of the third embodiment), the top plate 16 is designed at a low level to moderate the inclination of an inclined surface 24. The groove-like gap 17 is easily purged until it reaches the cover opening 18.

Seventh Embodiment

Figure 23:
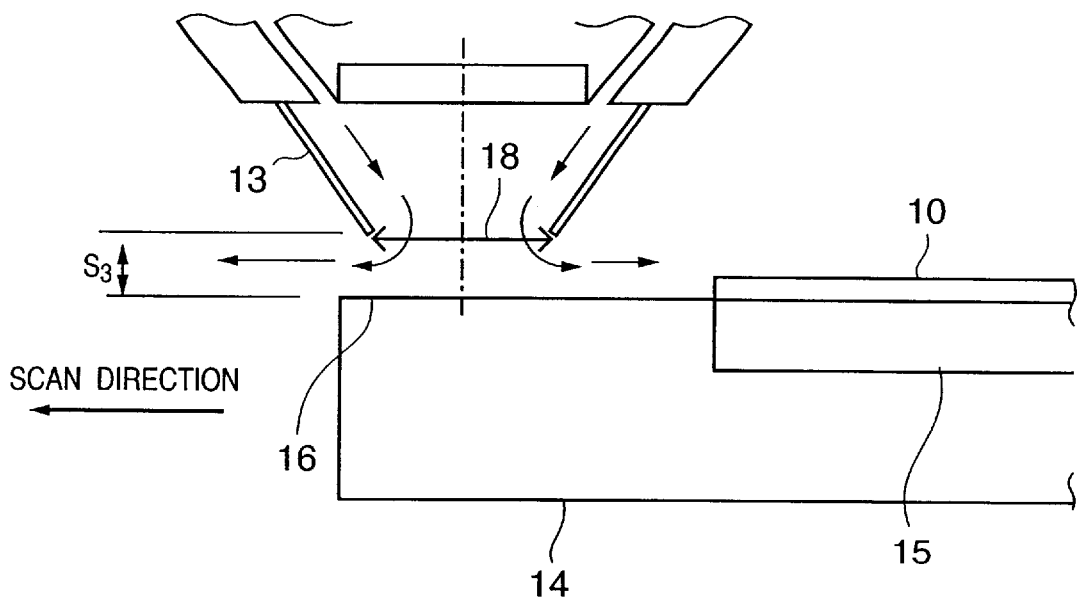
FIG. 23 is a sectional view showing the schematic structure of a projection exposure apparatus near a wafer according to the seventh embodiment of the present invention.

FIG. 23 shows an embodiment in which the surface of a top plate 16 is made almost flush with the wafer support surface of a chuck 15 or set at a lower level, thereby eliminating a groove-like gap 17. A gap s3 between the distal end of a cover 13 and the top plate 16 must be 5 mm or less. For this purpose, a gap s2 between the end of the cover 13 and a wafer 10 is set to 1 mm, and the thickness of the wafer 10 is assumed up to 1 mm. With this setting, the gap s3 can be decreased to 3 mm.

This structure has no recess. The surface of the top plate 16 including the vicinity of the wafer 10 is purged to almost no oxygen, moisture, or the like, until the wafer 10 reaches a cover opening 18. Even if the wafer 10 reaches the cover opening 18 and a flow into the cover 13 occurs, this flow hardly poses any problem.

The chuck 15 is buried such that its side surface is in tight contact with the side surface of a circular recess formed in a wafer stage 14 without or with the mediacy of an elastic member so as not to form any gap between the side surface of the chuck 15 and the top plate 16. The chuck 15 can be separated/detached from the wafer stage 14.

Figure 24:
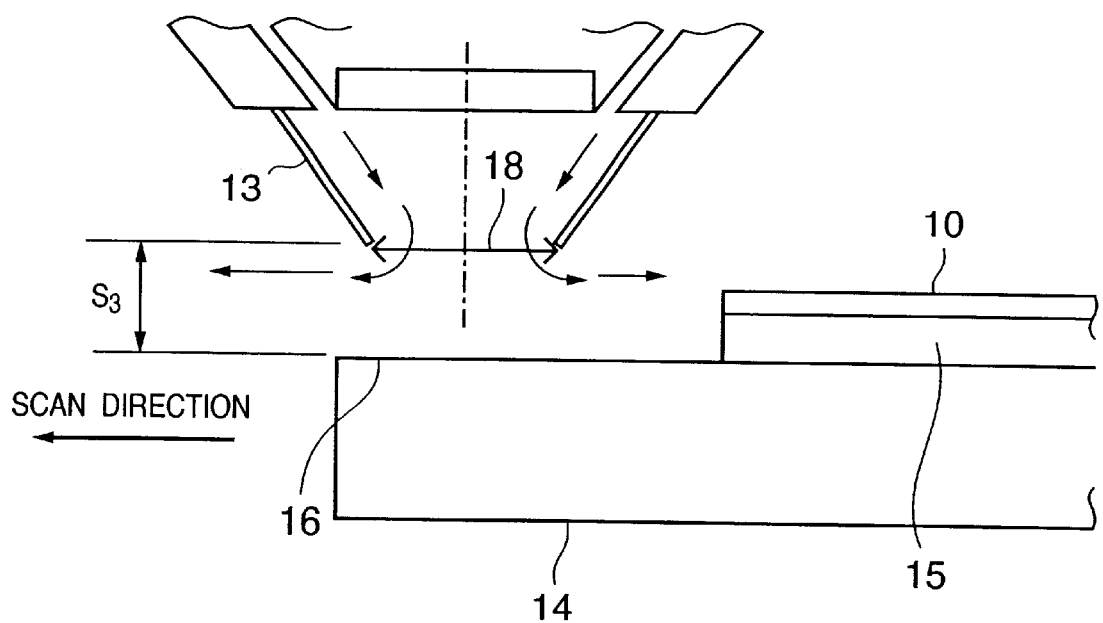
FIG. 24 is a sectional view showing the schematic structure of the projection exposure apparatus near the wafer according to the seventh embodiment of the present invention.

As shown in FIG. 24, the top plate surface may be made almost flush with the chuck support surface on the wafer stage 14 or set at a lower level, thereby eliminating the groove-like gap 17. This desirably facilitates detachment of the chuck 15 from the wafer stage 14 for chuck cleaning or the like. To obtain a desired purge effect, the gap s3 between the distal end of the cover 13 and the top plate 16 is desirably 5 mm or less. If the gap s2 between the distal end of the cover 13 and the wafer 10 is 1 mm, the total thickness of the wafer 10 and chuck 15 is desirably set to 4 mm or less. The gap s3 is preferably small, so that the chuck 15 is made as thin as about 5 to 3 mm. If the thickness of the chuck 15 is 2 mm, the top plate surface can be set at a low level by 2 mm from the chuck support surface on the wafer stage 14.

Figure 25:
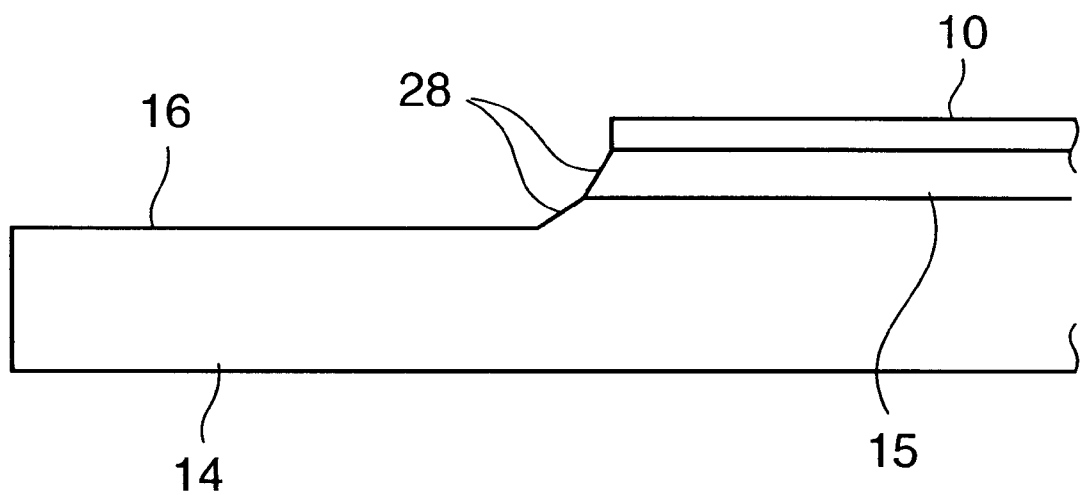
FIG. 25 is a sectional view showing the schematic structure of the projection exposure apparatus near the wafer according to the seventh embodiment of the present invention.

As shown in FIG. 25, an inclined surface 28 is formed on the side surface of the chuck 15 or on the side surface of a step between the chuck support surface on the wafer stage 14 and the top plate surface. The inclined surface 28 makes a flow of purge gas striking these side surfaces smoothly flow above the wafer 10. Accordingly, oxygen, moisture, or the like, is further purged. Note that the sectional shape of the inclined surface is not defined by one that is an oblique line, but may be defined by a combination of curves, horizontal lines, vertical lines, and oblique lines as far as the inclined surface gradually becomes shallower moderately to facilitate a flow.

Eighth Embodiment

In the first to seventh embodiments described above, the top plate 16 and wafer stage 14 may be implemented by an integral member or separate members, as needed. The chuck 15 and wafer stage 14 may also be implemented by an integral member. This arrangement can also achieve the same effects.

In the above embodiments, the interior of the cover 13 is purged by a plurality of nozzles 11. However, the present invention is not limited to this, and can be variously modified without departing from the spirit and scope of the present invention. For example, supply ports for supplying purge gas may serve as part or all of the cover of the present invention. More specifically, of four wall surfaces in the plan view of the cover 13, two wall surfaces facing each other may serve as supply ports for supplying purge gas, and purge gas may be supplied into the cover 13 from the two opposite directions. These directions may be along or perpendicular to the scan direction. Alternatively, one of two wall surfaces facing each other may serve as a supply port, and the other may serve as a recovery port for discharging purge gas. Alternatively, two wall surfaces other than two wall surfaces serving as supply or recovery ports may be replaced with air curtains for purge gas sprayed from air curtain nozzles similar to the nozzles 11. Alternatively, all of the four wall surfaces may serve as supply ports. Alternatively, all of the four wall surfaces may be replaced with air curtains, and purge gas may be supplied from the nozzles 11 into the air curtains.

In the above embodiments, the nozzles 11 are incorporated in the projection optical system 9. However, the nozzles 11 may be attached together with the cover 13 outside the projection optical system 9, or may be suspended from a surface plate which supports the projection optical system 9.

The above embodiments have exemplified a step & scan type projection exposure apparatus. The present invention can also be applied to a step & repeat type projection exposure apparatus in which, when a shot at the wafer periphery is to be exposed, the groove-like gap 17 moves from the outside to inside of the cover opening 18 and stops, and exposure starts.

The above embodiments have exemplified purge around the wafer, but the present invention is not limited to this. The present invention described above can be properly applied to purge around the reticle.

Embodiment of Semiconductor Production System

A production system for producing a semiconductor device (e.g., a semiconductor chip such as an IC or LSI, a liquid crystal panel, a CCD, a thin-film magnetic head, a micromachine, or the like) will be exemplified. A trouble remedy or periodic maintenance of a manufacturing apparatus installed in a semiconductor manufacturing factory, or maintenance service such as software distribution is performed by using a computer network outside the manufacturing factory.

Figure 31:
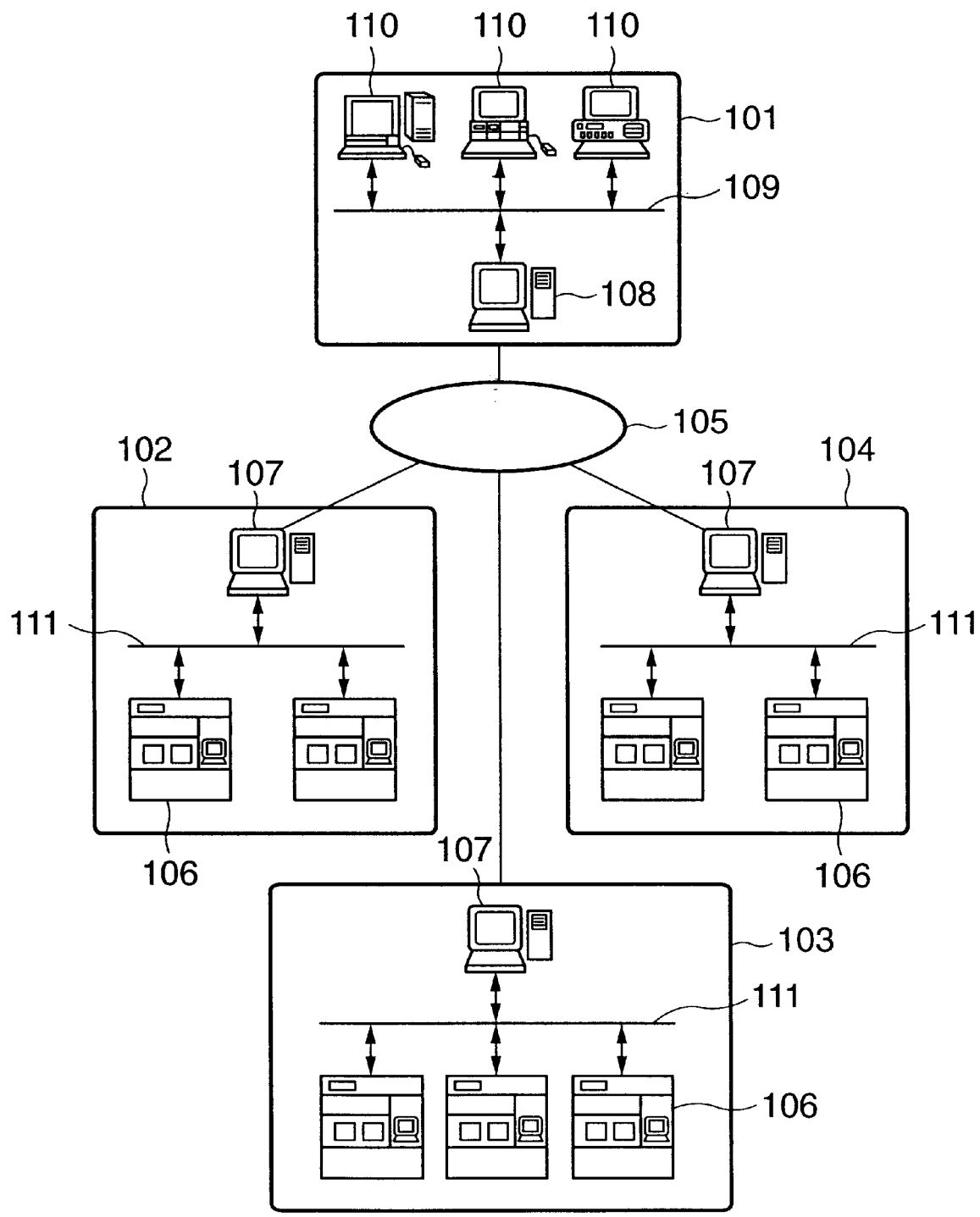
FIG. 31 is a view showing a semiconductor device production system when viewed from a given angle.

FIG. 31 shows the overall system cut out a given angle. In FIG. 31, reference numeral 101 denotes a business office of a vendor (apparatus supply manufacturer) which provides a semiconductor device manufacturing apparatus. Assumed examples of the manufacturing apparatus are semiconductor manufacturing apparatuses for performing various processes used in a semiconductor manufacturing factory, such as pre-process apparatuses (e.g., a lithography apparatus including an exposure apparatus, a resist processing apparatus, an etching apparatus, an annealing apparatus, a film formation apparatus, a pluralization apparatus, and the like) and post-process apparatuses (e.g., an assembly apparatus, an inspection apparatus, and the like). The business office 101 comprises a host management system 108 for providing a maintenance database for the manufacturing apparatus, a plurality of operation terminal computers 110, and a LAN (Local Area Network) 109 which connects the host management system 108 and computers 110 to construct an intranet. The host management system 107 has a gateway for connecting the LAN 109 to the internet 105 as an external network of the business office, and a security function for limiting external acesses.

Reference numerals 102 to 104 denote manufacturing factories of the semiconductor manufacturer as users of manufacturing apparatuses. The manufacturing factories 102 to 104 may belong to different manufacturers or the same manufacturer (e.g., a pre-process factory, a post-process factory, and the like). Each of the factories 102 to 104 is equipped with a plurality of manufacturing apparatuses 106, a LAN (Local Area Network) 111, which connects these apparatuses 106 to construct an intranet, and a host management system 107 serving as a monitoring apparatus for monitoring the operation status of each manufacturing apparatus 106. The host management system 107 in each of the factories 102 to 104 has a gateway for connecting the LAN 111 in the factory to the Internet 105 as an external network of the factory. Each factory can access the host management system 108 of the vendor 101 from the LAN 111 via the Internet 105. The security function of the host management system 108 authorizes access of only a limited user. More specifically, the factory notifies the vendor via the Internet 105 of status information (e.g., the symptom of a manufacturing apparatus in trouble) representing the operation status of each manufacturing apparatus 106. The factory can receive, from the vendor, response information (e.g., information designating a remedy against the trouble, or remedy software or data) corresponding to the notification, or maintenance information such as the latest software or help information. Data communication between the factories 102 to 104 and the vendor 101 and data communication via the LAN 111 in each factory adopt a communication protocol (TCP/IP) generally used in the Internet. Instead of using the Internet as an external network of the factory, a dedicated-line network (e.g., ISDN) having high security which inhibits access of a third party can be adopted. It is also possible that the user constructs a database in addition to one provided by the vendor and sets the database on an external network and that the host management system authorizes access to the database from a plurality of user factories.

Figure 32:
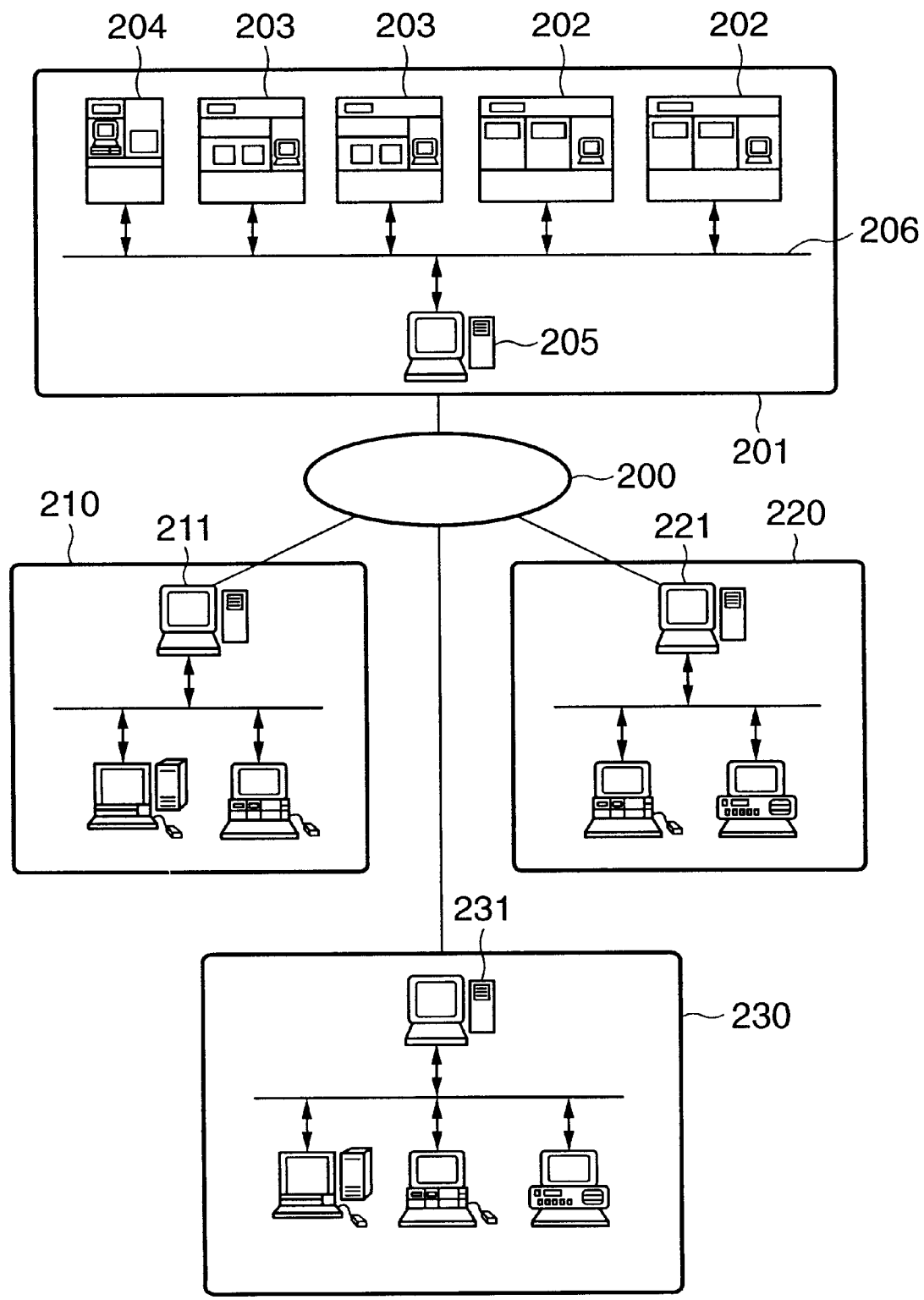
FIG. 32 is a view showing the semiconductor device production system when viewed from another angle.

FIG. 32 is a view showing the concept of the overall system of this embodiment that is cut out at a different angle from FIG. 31. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 32, a factory having manufacturing apparatuses of a plurality of vendors, and the management systems of the vendors for these manufacturing apparatuses are connected via the external network of the factory, and maintenance information of each manufacturing apparatus is communicated. In FIG. 32, reference numeral 201 denotes a manufacturing factory of a manufacturing apparatus user (semiconductor device manufacturer) where manufacturing apparatuses for performing various processes, e.g., an exposure apparatus 202, a resist processing apparatus 203, and a film formation apparatus 204 are installed in the manufacturing line of the factory. FIG. 32 shows only one manufacturing factory 201, but a plurality of factories are networked in practice. The respective apparatuses in the factory are connected to a LAN 206 to construct an intranet, and a host management system 205 manages the operation of the manufacturing line. The business offices of vendors (apparatus supply manufacturers) such as an exposure apparatus manufacturer 210, a resist processing apparatus manufacturer 220, and a film formation apparatus manufacturer 230 comprise host management systems 211, 221, and 231 for executing remote maintenance for the supplied apparatuses. Each host management system has a maintenance database and a gateway for an external network, as described above. The host management system 205 for managing the apparatuses in the manufacturing factory of the user, and the management systems 211, 221, and 231 of the vendors for the respective apparatuses are connected via the Internet or dedicated-line network serving as an external network 200. If trouble occurs in any one of a series of manufacturing apparatuses along the manufacturing line in this system, the operation of the manufacturing line stops. This trouble can be quickly solved by remote maintenance from the vendor of the apparatus in trouble via the Internet 200. This can minimize the stop of the manufacturing line.

Each of the manufacturing apparatuses in the semiconductor manufacturing factory comprises a display, a network interface, and a computer for executing network access software and apparatus operating software, which are stored in a storage device. The storage device is a built-in memory, hard disk, or network file server. The network access software includes a dedicated or general-purpose web browser, and provides a user interface having a window as shown in FIG. 33 on the display. While referring to this window, the operator who manages manufacturing apparatuses in each factory inputs, in input items on the windows, pieces of information such as the type of manufacturing apparatus (401), serial number (402), subject of trouble (403), occurrence date (404), degree of urgency (405), symptom (406), remedy (407), and progress (408). The pieces of input information are transmitted to the maintenance database via the Internet, and appropriate maintenance information is sent back from the maintenance database and displayed on the display. The user interface provided by the web browser realizes hyperlink functions (410 to 412), as shown in FIG. 33. This allows the operator to access detailed information of each item, receive the latest-version software to be used for a manufacturing apparatus from a software library provided by a vendor, and receive an operation guide (help information) as a reference for the operator in the factory. The maintenance information provided by the maintenance database also includes information about the features of the present invention described above. The software library also provides the latest-version software for implementing the features of the present invention.

Embodiment of Semiconductor Device Manufacturing Process

Figure 34:
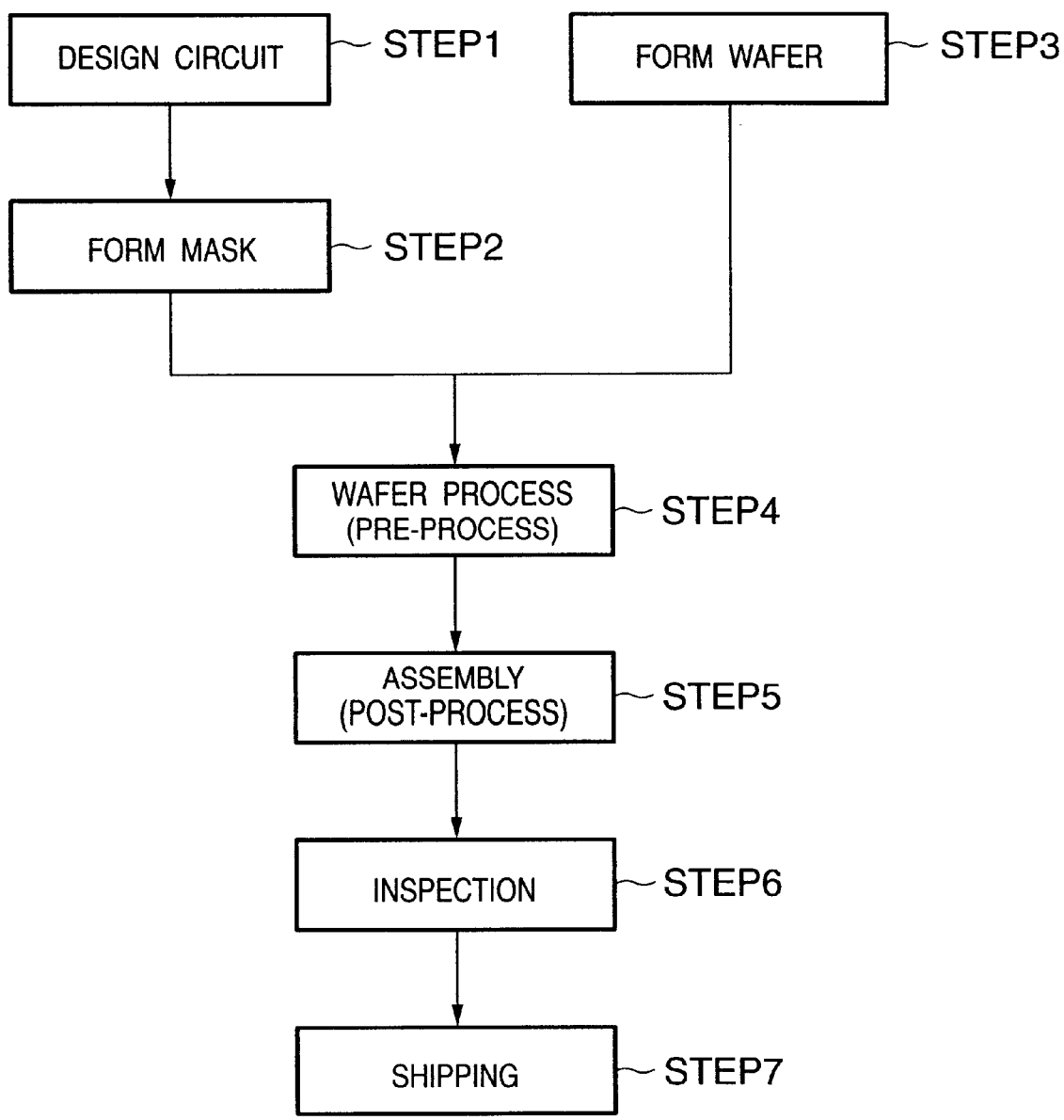
FIG. 34 is a flow chart showing a semiconductor device manufacturing process.

A semiconductor device manufacturing process using the above-described production system will be explained. FIG. 34 shows the flow of the whole manufacturing process of the semiconductor device. In step 1 (circuit design), a semiconductor device circuit is designed. In step 2 (mask formation), a mask having a designed circuit pattern is formed. In step 3 (wafer formation), a wafer is formed using a material such as silicon. In step 4 (wafer process) called a pre-process, an actual circuit is formed on the wafer by lithography using the prepared mask and wafer. Step 5 (assembly) called a post-process is the step of forming a semiconductor chip by using the wafer manufactured in step 4, and includes an assembly process (dicing and bonding) and packaging process (chip encapsulation). In step 6 (inspection), inspections such as the operation confirmation test and durability test of the semiconductor device manufactured in step 5 are conducted. After these steps, the semiconductor device is completed and shipped (step 7). The pre-process and post-process are performed in separate dedicated factories, and maintenance is done for each of the factories by the above-described remote maintenance system. Information for production management and apparatus maintenance is communicated between the pre-process factory and the post-process factory via the Internet or dedicated-line network.

Figure 35:
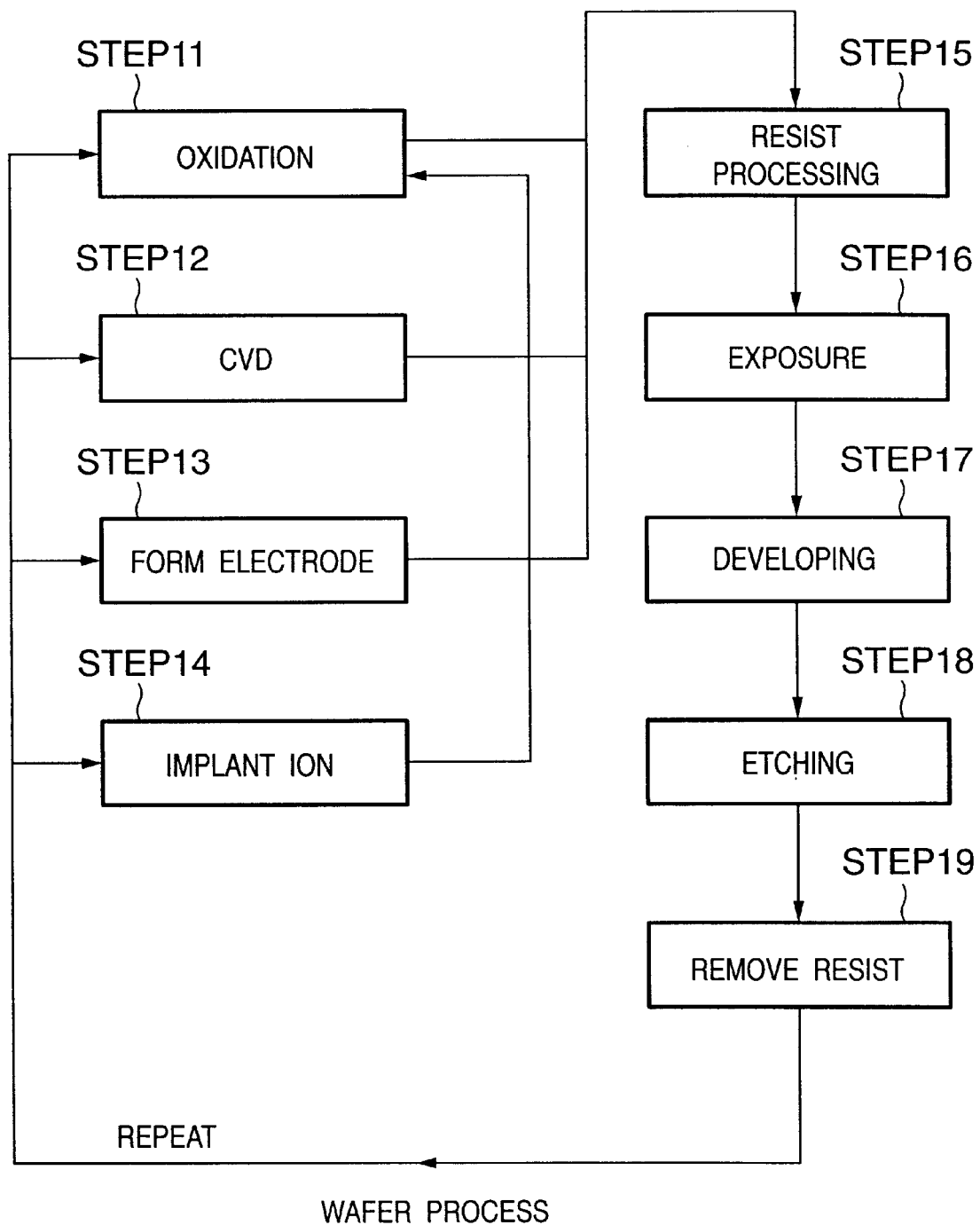
FIG. 35 is a flow chart for explaining a wafer process.

FIG. 35 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern of a mask. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

As has been described above, the present invention can partially, effectively purge oxygen and moisture near a wafer. A satisfactory transmittance and stability of exposure light can be obtained. Exposure can be done with high precision, and a fine circuit pattern can be properly projected.

As many apparently widely different embodiments of the present invention can be made without departing from the spirit and scope thereof, it is to be understood that the invention is not limited to the specific embodiments thereof except as defined in the claims.

What is claimed is:

1. A scanning exposure apparatus for exposing a substrate with a pattern formed on an original while scanning the original and the substrate, the apparatus comprising:
    a chuck for holding a substrate;
    a stage for moving said chuck to align the substrate;
    a mechanism for purging an exposure optical path near said stage with inert gas, said mechanism having a cover covering the exposure optical path between a substrate-side lower end of an optical system and a vicinity of said stage, and a supply port for supplying inert gas into said cover; and
    a top plate which is mounted on said stage and has a surface substantially flush with a surface of the substrate,
    wherein said top plate is arranged to form a gap between said top plate and a side surface of the substrate, a depth of the gap is not less than a width of the gap, and a dimension from the side surface of the substrate to an outer edge of said top plate is larger than that of a substrate-side opening of said cover in a scanning direction.

2. The apparatus according to claim 1, wherein a side surface of said chuck has an inclined surface not perpendicular to the surface of the substrate.

3. The apparatus according to claim 1, wherein a side surface of a step formed by the surface of said top plate, and a bottom of the gap between the side surface of the substrate and said top plate has an inclined surface not perpendicular to the surface of the substrate.

4. The apparatus according to claim 1, wherein a depth of the gap is not less than one mm from the surface of the substrate.

5. The apparatus according to claim 1, wherein a difference between the surface of the substrate and the surface of said top plate is not more than four mm.

6. A scanning exposure apparatus for exposing a substrate with a pattern formed on an original while scanning the original and the substrate, the apparatus comprising:
    a chuck for holding a substrate;
    a stage for moving said chuck to align the substrate;
    a mechanism for purging an exposure optical path near said stage with inert gas, said mechanism having a cover covering the exposure optical path between a substrate-side lower end of an optical system and a vicinity of said stage, and a supply port for supplying inert gas into said cover; and
    a top plate which is mounted on said stage and has a surface substantially flush with a substrate support surface of said chuck,
    wherein a dimension from a side surface of the substrate to an outer edge of said top plate is larger than that of a substrate-side opening of said cover in a scanning direction.

7. The apparatus according to claim 6, wherein
    said chuck and said top plate are arranged to form a gap between a side surface of said chuck and said top plate, and
    said exposure apparatus further comprises a vent hole which communicates with the gap and is larger in volume than the gap.

8. The apparatus according to claim 6, wherein an interval between a side surface of said chuck and said top plate is small at an upper portion of said chuck and is larger at a lower portion of said chuck.

9. The apparatus according to claim 6, further comprising a supply port for supplying gas into the gap formed between a side surface of said chuck and said top plate.

10. The apparatus according to claim 6, further comprising a vent hole which makes the gap formed between a side surface of said chuck and said top plate communicate with the surface of said top plate.

11. The apparatus according to claim 6, further comprising a vent hole which makes the gap formed between a side surface of said chuck and said top plate communicate with an opening formed in a side surface of said stage.

12. The apparatus according to claim 11, wherein an angle defined by the side surface having the opening and a scan direction of said stage is not more than thirty degrees.

13. The apparatus according to claim 6, wherein a side surface of said chuck has an inclined surface not perpendicular to a surface of the substrate.

14. The apparatus according to claim 6, wherein a difference in level between the substrate support surface of said chuck and the surface of said top plate is not more than three mm.

15. A scanning exposure apparatus for exposing a substrate with a pattern formed on an original while scanning the original and the substrate, the apparatus comprising:
- a chuck for holding a substrate;
- a stage for moving said chuck to align the substrate;
- a mechanism for purging an exposure optical path near said stage with inert gas, said mechanism having a cover covering the exposure optical path between a substrate-side lower end of an optical system and a vicinity of said stage, and a supply port for supplying inert gas into said cover; and
- a top plate which is mounted on said stage and has a surface substantially flush with a surface of said stage on which said chuck is held,
- wherein a dimension from a side surface of the substrate to an outer edge of said top plate is larger than that of a substrate-side opening of said cover in a scanning direction.

16. The apparatus according to claim 15, wherein a difference in level between the surface of said top plate and the surface of said stage on which said chuck is held is not more than two mm.

17. The apparatus according to claim 15, wherein a side surface of a step formed by the surface of said top plate, and a bottom of a gap between a side surface of the substrate and said top plate has an inclined surface not perpendicular to a surface of the substrate.

18. The apparatus according to claim 15, wherein a difference between a surface of the substrate and the surface of said top plate is not more than four mm.

19. The apparatus according to claim 16, wherein a side surface of a step formed by the surface of said top plate, and a bottom of a gap between a side surface of the substrate and said top plate has an inclined surface not perpendicular to a surface of the substrate.

20. The apparatus according to claim 16, wherein a difference between a surface of the substrate and the surface of said top plate is not more than four mm.

21. The apparatus according to claim 17, wherein the side surface of the step formed by the surface of said top plate, and the bottom of the gap between the side surface of the substrate and said top plate has an inclined surface not perpendicular to the surface of the substrate.

22. The apparatus according to claim 17, wherein the difference between the surface of the substrate and the surface of said top plate is not more than four mm.

23. A scanning exposure apparatus comprising:
- a chuck for holding a substrate for exposing a substrate with a pattern formed on an original while scanning the original and the substrate,
- the apparatus comprising:
  - a stage for moving said chuck to align the substrate;
  - a mechanism for purging an exposure optical path near said stage with inert gas, said mechanism having a cover covering the exposure optical path between a substrate-side lower end of an optical system and a vicinity of said stage, and a supply port for supplying inert gas into said cover;
  - a top plate which is mounted on said stage and has a surface substantially flush with a surface of the substrate; and
  - a vent hole which communicates with a gap between a side surface of the substrate and said top plate, and is larger in volume than the gap,
  - wherein a dimension from the side surface of the substrate to an outer edge of said top plate is larger than that of a substrate-side opening of said cover in a scanning direction.

24. The apparatus according to claim 23, wherein a side surface of a step formed by the surface of said top plate, and a bottom of a gap between the side surface of the substrate and said top plate has an inclined surface not perpendicular to the surface of the substrate.

25. The apparatus according to claim 23, wherein a difference between the surface of the substrate and the surface of said top plate is not more than four mm.

26. An exposure apparatus comprising:
- a chuck for holding a substrate;
- a stage for moving said chuck to align the substrate;
- a mechanism for purging an exposure optical path near said stage with inert gas; and
- a top plate which is mounted on said stage and forms a surface substantially flush with a surface of the substrate,
- wherein a gap between a side surface of the substrate and the surface of said top plate is smaller in width than a gap between a side surface of said chuck and said top plate.

27. The apparatus according to claim 26, wherein a side surface of a step formed by the surface of said top plate, and a bottom of a gap between the side surface of the substrate and said top plate has an inclined surface not perpendicular to the surface of the substrate.

28. The apparatus according to claim 26, wherein a difference between the surface of the substrate and the surface of said top plate is not more than four mm.

29. A scanning exposure apparatus for exposing a substrate with a pattern formed on an original while scanning the original and the substrate, the apparatus comprising:
- a chuck for holding a substrate;
- a stage for moving said chuck to align the substrate;
- a mechanism for purging an exposure optical path near said stage with inert gas, said mechanism having a cover covering the exposure optical path between a substrate-side lower end of an optical system and a vicinity of said stage, and a first supply port for supplying inert gas into said cover;
- a top plate which is mounted on said stage and forms a surface flush with a surface of the substrate; and
- a second supply port for supplying inert gas into a gap formed between a side surface of the substrate and said top plate;
- wherein a dimension from the side surface of the substrate to an outer edge of said top plate is larger than that of a substrate-side opening of said cover in a scanning direction.

30. The apparatus according to claim 29, wherein a side surface of a step formed by the surface of said top plate, and a bottom of a gap between the side surface of the substrate and said top plate has an inclined surface not perpendicular to the surface of the substrate.

31. The apparatus according to claim 29, wherein a difference between the surface of the substrate and the surface of said top plate is not more than four mm.

32. An exposure apparatus comprising:
- a chuck for holding a substrate;
- a stage for moving said chuck to align the substrate;
- a mechanism for purging an exposure optical path near said stage with inert gas;
- a top plate which is mounted on said stage and forms a surface flush with a surface of the substrate; and a vent hole which makes a gap between a side surface of the substrate and said top plate communicate with the surface of said top plate.

33. The apparatus according to claim 32, wherein a side surface of a step formed by the surface of said top plate, and a bottom of a gap between the side surface of the substrate and said top plate has an inclined surface not perpendicular to the surface of the substrate.

34. The apparatus according to claim 32, wherein a difference between the surface of the substrate and the surface of said top plate is not more than four mm.

35. An exposure apparatus comprising:
a chuck for holding a substrate;
a stage for moving said chuck to align the substrate;
a mechanism for purging an exposure optical path near said stage with inert gas;
a top plate which is mounted on said stage and forms a surface flush with a surface of the substrate; and
a vent hole which makes a gap between a side surface of the substrate and said top plate communicate with a side surface, of said stage, substantially parallel to a scan direction of said stage.

36. The apparatus according to claim 35, wherein a side surface of a step formed by the surface of said top plate, and a bottom of a gap between the side surface of the substrate and said top plate has an inclined surface not perpendicular to the surface of the substrate.

37. The apparatus according to claim 35, wherein a difference between the surface of the substrate and the surface of said top plate is not more than four mm.

38. An exposure apparatus comprising:
a chuck for holding a substrate;
a stage for moving said chuck to align the substrate;
a mechanism for purging an exposure optical path near said stage with inert gas; and
a top plate which is mounted on said stage to hold said chuck,
wherein a side surface of said chuck has an inclined surface.

39. An exposure apparatus comprising:
a chuck for holding a substrate;
a stage for moving said chuck to align the substrate;
a mechanism for purging an exposure optical path near said stage with inert gas; and
a top plate which is mounted on said stage to hold said chuck,
wherein a side surface of said top plate has an inclined surface.

40. A scanning exposure apparatus for exposing a substrate with a pattern formed on an original while scanning the original and the substrate, the apparatus comprising:
a chuck for holding a substrate;
a stage for moving said chuck to align the substrate;
a mechanism for purging an exposure optical path near said stage with inert gas, said mechanism having a cover covering the exposure optical path between a substrate-side lower end of an optical system and a vicinity of said stage, and a supply port for supplying inert gas into said cover; and
a top plate which is mounted on said stage and has a surface substantially flush with a surface of the substrate,
wherein a shorter-side direction of an opening of said cover is substantially parallel to a scan direction of said stage, said top plate is arranged to form a gap between said top plate and a side surface of the substrate, and a depth of the gap is not less than a width of the gap.

41. A scanning exposure apparatus for exposure with a substrate with a pattern formed on an original while scanning the original and the substrate, the apparatus comprising:
a chuck for holding a substrate;
a stage for moving said chuck to align the substrate;
a mechanism for purging an exposure optical path near said stage with inert gas, said mechanism having a cover covering the exposure optical path between a substrate-side lower end of an optical system and a vicinity of said stage, and a supply port for supplying inert gas into said cover, and
a top plate which is mounted on said stage and has a surface substantially flush with a substrate support surface of said chuck,
wherein a shorter-side direction of an opening of said cover is substantially parallel to a scan direction of said stage.

42. The apparatus according to claim 41, wherein
said chuck and said top plate are arranged to form a gap between a side surface of said chuck and said top plate, and
said exposure apparatus further comprises a vent hole which communicates with the gap and is larger in volume than the gap.

43. A scanning exposure apparatus for exposing a substrate with a pattern formed on an original while scanning the original and the substrate, the apparatus comprising:
a chuck for holding a substrate;
a stage for moving said chuck to align the substrate;
a mechanism for purging an exposure optical path near said stage with inert gas, said mechanism having a cover covering the exposure optical path between a substrate-side lower end of an optical system and a vicinity of said stage, and a supply port for supplying inert gas into said cover; and
a top plate which is mounted on said stage and has a surface substantially flush with a surface of said stage on which said chuck is held,
wherein a shorter-side direction of an opening is substantially parallel to a scan direction of said stage.

44. A scanning exposure apparatus comprising:
a chuck for holding a substrate for exposing a substrate with a pattern formed on an original while scanning the original and the substrate;
the apparatus comprising:
a stage for moving said chuck to align the substrate;
a mechanism for purging an exposure optical path near said stage with inert gas, said mechanism having a cover covering the exposure optical path between a substrate-side lower end of an optical system and a vicinity of said stage, and a supply port for supplying inert gas into said cover;
a top plate which is mounted on said stage and has a surface substantially flush with a surface of the substrate; and
a vent hole which communicates with a gap between a side surface of the substrate and said top plate, and is larger in volume than the gap,
wherein a shorter-side direction of an opening is substantially parallel to a scan direction of said stage.

45. A scanning exposure apparatus for exposing a substrate with a pattern formed on an original while scanning the original and the substrate, the apparatus comprising:

a chuck for holding a substrate;

a stage for moving said chuck to align the substrate;

a mechanism for purging an exposure optical path near said stage with inert gas, said mechanism having a cover covering the exposure optical path between a substrate-side lower end of an optical system and a vicinity of said stage, and a first supply port for supplying inert gas into said cover;

a top plate which is mounted on said stage and forms a surface flush with a surface of the substrate; and a second supply port for supplying inert gas into a gap formed between a side surface of the substrate and said top plate, wherein a shorter-side direction of an opening is substantially parallel to a scan direction of said stage.

46. The apparatus according to any one of claims 40–45, wherein said optical system includes a projection optical system, and the substrate includes a member coated with a photosensitive agent.

47. The apparatus according to any one of claims 40–45, wherein said optical system includes an illumination optical system, and the substrate includes a master having a pattern.

48. The apparatus according to any one of claims 40–45, wherein said supply port includes at least one nozzle.

49. The apparatus according to any one of claims 40–45, wherein said supply port also serves as said cover.

50. The apparatus according to any one of claims 40–45, wherein said mechanism further comprises a recovery port for discharging purge gas from inside of said cover.

51. The apparatus according to any one of claims 40–45, wherein said cover includes an air curtain formed from inert gas.

52. The apparatus according to any one of claims 26–28, 32, 33, 35 and 37–39, wherein said mechanism has a cover for covering an exposure optical path from a substrate-side lower end of an optical system to a vicinity of said stage, and a supply port for supplying inert gas into said cover.

53. The apparatus according to claim 52, wherein said optical system includes a projection optical system, and the substrate includes a member coated with a photosensitive agent.

54. The apparatus according to claim 52, wherein said optical system includes an illumination optical system, and the substrate includes a master having a pattern.

55. The apparatus according to claim 52, wherein said supply port includes at least one nozzle.

56. The apparatus according to claim 52, wherein said supply port also serves as said cover.

57. The apparatus according to claim 52, wherein said mechanism further comprises a recovery port for discharging purge gas from inside of said cover.

58. The apparatus according to claim 42, wherein said cover includes an air curtain formed from inert gas.

59. The apparatus according to any one claims 1–45, wherein the inert gas includes any one of nitrogen, helium, and argon.

60. The apparatus according to any one of claims 1–45, wherein said top plate is integrated with said stage.

61. The apparatus according to any one of claims 1–45, wherein the exposure light includes ultraviolet rays.

62. The apparatus according to claim 61, wherein the ultraviolet rays are provided by a laser beam from a laser serving as a light source.

63. The apparatus according to claim 62, wherein the laser includes one of a fluorine and an ArF excimer laser.

64. A device manufacturing method comprising the steps of:

installing, in a semiconductor manufacturing factory, manufacturing apparatuses, for performing various processes, including the exposure apparatus defined in any one of claims 1–45; and manufacturing a semiconductor device by performing a plurality of processes using the manufacturing apparatuses.

65. The method according to claim 64, further comprising the steps of:

connecting the manufacturing apparatuses via a local area network; and communicating information about at least one of the manufacturing apparatuses between the local area network and an external network outside the semiconductor manufacturing factory.

66. The method according to claim 64, further comprising performing one of (i) accessing a database provided by a vendor or user of the exposure apparatus by data communication via the external network, thereby obtaining maintenance information of the exposure apparatus, and (ii) performing data communication between the semiconductor manufacturing factory and another semiconductor manufacturing factory via the external network, thereby performing production management.

67. A semiconductor manufacturing factory comprising:

manufacturing apparatuses, for performing various processes, including the exposure apparatus defined in any one of claim 1–45;

a local area network for connecting said manufacturing apparatuses; and a gateway for allowing access to an external network outside said factory from said local area network, wherein information about at least one of said manufacturing apparatuses is communicated.

68. A maintenance method for the exposure apparatus defined in any one of claims 1–45, which is installed in a semiconductor manufacturing factory, the maintenance method comprising the steps of:

making a vendor or user of the exposure apparatus provide a maintenance database connected to an external network outside the semiconductor manufacturing factory;

allowing access to the maintenance database from the semiconductor manufacturing factory via the external network; and transmitting maintenance information accumulated in the maintenance database to the semiconductor manufacturing factory via the external network.

69. The apparatus according to any one of claims 1–45, wherein the apparatus further comprises:

a display;

a network interface; and a computer for executing network access software, wherein said display, said network interface, and said computer enable communicating maintenance information of the exposure apparatus via a computer network.

70. The apparatus according to claim 69, wherein said network software provides on said display said user interface for accessing a maintenance database provided by a vendor or user of said exposure apparatus and connected to the external network outside a factory in which said exposure apparatus is installed, and information is obtained from the database via said external network.

* * * * *